(12) United States Patent
Kim et al.

(10) Patent No.: US 11,908,806 B2
(45) Date of Patent: Feb. 20, 2024

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Dong Ho Kim, Hwaseong-si (KR); Ji Hwang Kim, Cheonan-si (KR); Hwan Pil Park, Hwaseong-si (KR); Jong Bo Shim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 17/501,008

(22) Filed: Oct. 14, 2021

(65) Prior Publication Data

US 2022/0165680 A1 May 26, 2022

(30) Foreign Application Priority Data

Nov. 26, 2020 (KR) ........................ 10-2020-0160659

(51) Int. Cl.
| | |
|---|---|
| *H01L 23/552* | (2006.01) |
| *H01L 23/498* | (2006.01) |
| *H01L 21/56* | (2006.01) |
| *H01L 23/42* | (2006.01) |
| *H01L 21/48* | (2006.01) |

(52) U.S. Cl.
CPC ........ *H01L 23/552* (2013.01); *H01L 21/4853* (2013.01); *H01L 21/56* (2013.01); *H01L 23/42* (2013.01); *H01L 23/49816* (2013.01); *H01L 23/49822* (2013.01); *H01L 23/49838* (2013.01)

(58) Field of Classification Search
None
See application file for complete search history.

(56) References Cited

U.S. PATENT DOCUMENTS

| | | | |
|---|---|---|---|
| 7,614,774 B2 | 4/2009 | Leung et al. | |
| 8,861,221 B2 | 10/2014 | Pagaila | |
| 9,337,137 B1 | 5/2016 | Mills | |
| 9,842,809 B2* | 12/2017 | Moon | .................. H01L 23/544 |
| 2017/0047293 A1* | 2/2017 | Moon | ............... H01L 23/49838 |
| 2017/0287847 A1* | 10/2017 | Dias | ...................... H01L 23/552 |
| 2020/0219822 A1 | 7/2020 | Kim et al. | |

\* cited by examiner

*Primary Examiner* — Long Pham
(74) *Attorney, Agent, or Firm* — F. CHAU & ASSOCIATES, LLC

(57) ABSTRACT

A semiconductor package includes a first substrate that includes a first insulating layer, a ground pattern in the first insulating layer, and a first conductive pattern; a first semiconductor chip placed on an upper surface of the first substrate; a ball array structure that is placed on the upper surface of the first substrate along a perimeter of the first semiconductor chip and is electrically connected to the ground pattern; and a shielding structure placed on the upper surface of the first semiconductor chip and in contact with the upper surface of the ball array structure. The ball array structure has a closed loop shape, and includes a solder ball portion and a connecting portion that connects adjacent solder ball portions. A maximum width of the solder ball portion is greater than a width of the connecting portion in a direction perpendicular to an extension direction of the connecting portion.

19 Claims, 21 Drawing Sheets

FIG. 23
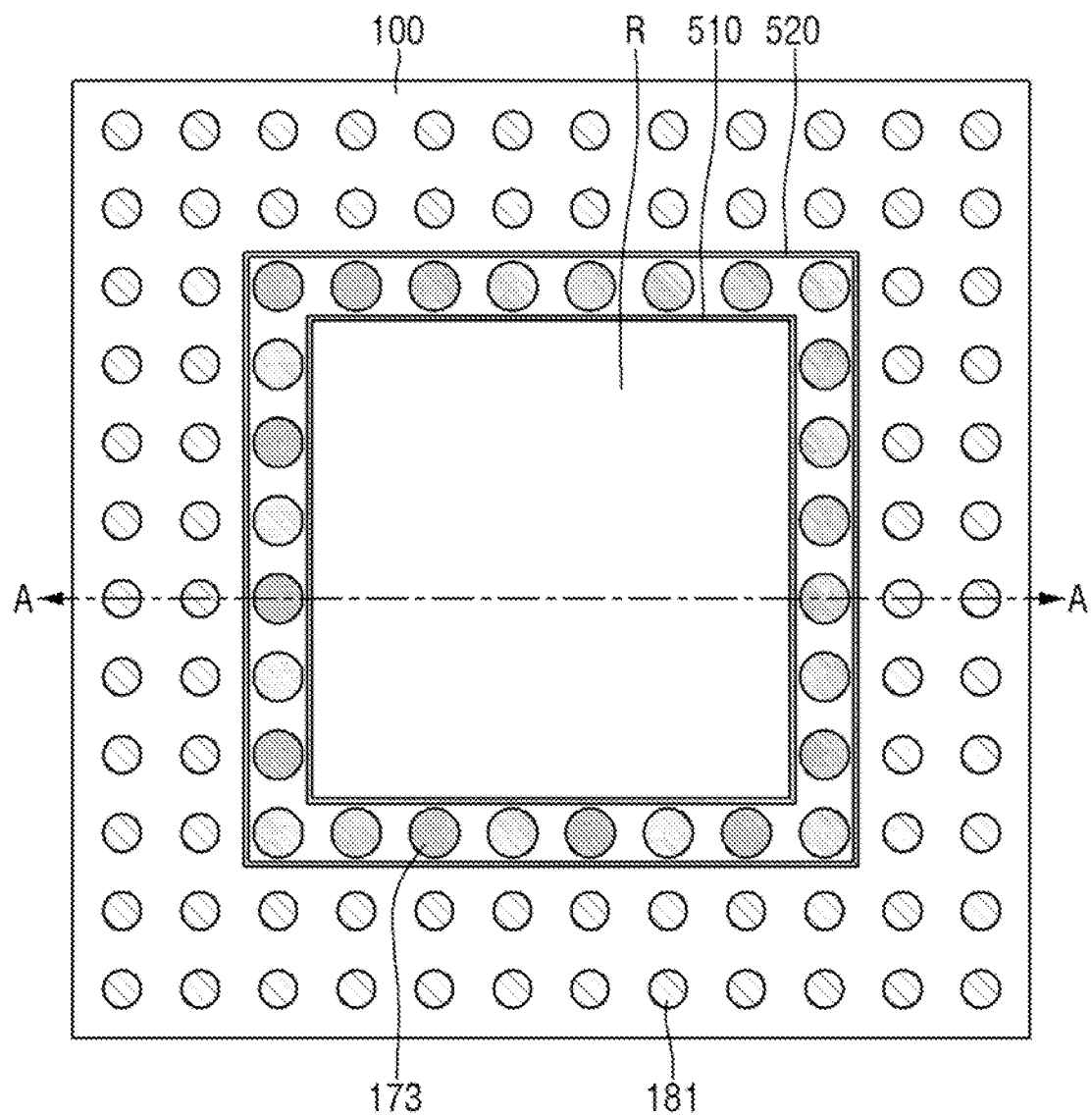
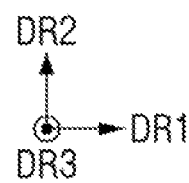

SEMICONDUCTOR PACKAGE AND METHOD OF FABRICATING THE SAME

CROSS-REFERENCE TO RELATED APPLICATION

This application claims priority under 35 U.S.C. § 119 from Korean Patent Application No. 10-2020-0160659, filed on Nov. 26, 2020 in the Korean Intellectual Property Office, the contents of which are herein incorporated by reference in their entirety.

TECHNICAL FIELD

Embodiments of the present inventive concepts are directed to a semiconductor package and a method of fabricating the same.

DISCUSSION OF RELATED ART

With the development of the electronics industry, there are increasing demands for higher functionality, higher speed, and smaller size of electronic devices. In response to these demands, a method of stacking and mounting a plurality of semiconductor chips on a single package substrate or stacking a package on a package may be used. For example, a package-in-package (PIP) type semiconductor package or a package-on-package (POP) type semiconductor package may be used.

In addition, research and development of electromagnetic wave shielding technology to prevent interference between components in the electronic devices are being continuously conducted.

SUMMARY

Embodiments of the present inventive concept provide a semiconductor package which has a reduced size and an improved electromagnetic interference (EMI) shielding.

Embodiments of the present inventive concept also provide a method of fabricating a semiconductor package which has a reduced size and an improved electromagnetic interference (EMI) shielding.

According to an exemplary embodiment of the present inventive concepts, a semiconductor package includes a first substrate that includes a first insulating layer, a ground pattern in the first insulating layer, and a first conductive pattern; a first semiconductor chip placed on an upper surface of the first substrate; a ball array structure that is placed on the upper surface of the first substrate, is electrically connected to the ground pattern, extends along a perimeter of the first semiconductor chip, and is spaced apart from side walls of the first semiconductor chip; and a shielding structure that is placed on the upper surface of the first semiconductor chip, and is contact with at least a part of the upper surface of the ball array structure. The ball array structure has a closed loop shape, and includes a solder ball portion and a connecting portion that connects adjacent solder ball portions. A maximum width in a first direction parallel to the upper surface of the first substrate of the solder ball portion is greater than a width of the connecting portion in a direction perpendicular to an extension direction of the connecting portion between adjacent solder ball portions.

According to an exemplary embodiment of the present inventive concepts, a semiconductor package includes a first substrate that includes a first insulating layer, and a ground pattern and a first conductive pattern inside the first insulating layer; a first semiconductor chip placed on an upper surface of the first substrate; a ball array structure that is placed on an upper surface of the first substrate, is electrically connected to the ground pattern, extends along a perimeter of the first semiconductor chip and is adjacent to the first semiconductor chip; and a shielding structure that is placed on an upper surface of the first semiconductor chip and is in contact with at least a part of an upper surface of the ball array structure. The ball array structure has a closed loop shape and includes a material that differs from that of the shielding structure.

According to an exemplary embodiment of the present inventive concepts, a semiconductor package includes a first substrate that includes a first insulating layer, a ground pattern in the first insulating layer, and a first conductive pattern; a first semiconductor chip placed on an upper surface of the first substrate; a ball array structure placed on the upper surface of the first substrate and adjacent to the first semiconductor chip, wherein the ball array structure is electrically connected to the ground pattern, extends along a perimeter of the first semiconductor chip, and has a closed loop shape; a shielding structure disposed on the upper surface of the first semiconductor chip, wherein the shielding structure is in contact with at least a part of an upper surface of the ball array structure and the upper surface of the first semiconductor chip; an interposer placed on the shielding structure wherein the interposer a second insulating layer and a second conductive pattern placed in the second insulating layer; a connection terminal placed between the first substrate and the interposer wherein the connection terminal electrically connects the first conductive pattern and the second conductive pattern; a second substrate placed on the interposer; and a second semiconductor chip placed on the second substrate wherein the second semiconductor chip is electrically connected to the first substrate through the second substrate, the interposer, and the connection terminal. The ball array structure includes a solder ball portion that is spaced apart from the first semiconductor chip, and a connecting portion that connects adjacent solder ball portions. A maximum width in a first direction parallel to the upper surface of the first substrate of the solder ball portion is greater than a maximum width of the connecting portion in a direction perpendicular to an extension direction of the connecting portion between adjacent solder ball portions, and is greater than a maximum width of the connection terminal, in the first direction. The shielding structure includes a material that differs from that of the ball array structure.

According to an exemplary embodiment of the present inventive concepts, a method of fabricating a semiconductor package includes forming a ball array structure on an upper surface of a first substrate, where the first substrate includes a first insulating layer, a ground pattern in the first insulating layer, and a first conductive pattern, and the ball array structure is electrically connected to the ground pattern and has a closed loop shape; mounting a first semiconductor chip on the upper surface of the first substrate inside the ball array structure and spaced apart from the ball array structure; forming a lower molding film on the first substrate where the lower molding film covers the first semiconductor chip and the ball array structure; etching the lower molding film to expose the upper surface of the ball array structure and the upper surface of the first semiconductor chip; and forming a shielding structure on the lower molding film, the upper surface of the exposed ball array structure, and the upper surface of the first semiconductor chip. The ball array structure includes a solder ball portion, and a connecting portion that connects adjacent solder ball portions.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

FIGS. 23 to 25 illustrate intermediate stages of a method of fabricating a semiconductor package according to some embodiments.

DETAILED DESCRIPTION OF THE EMBODIMENTS

Figure 1:
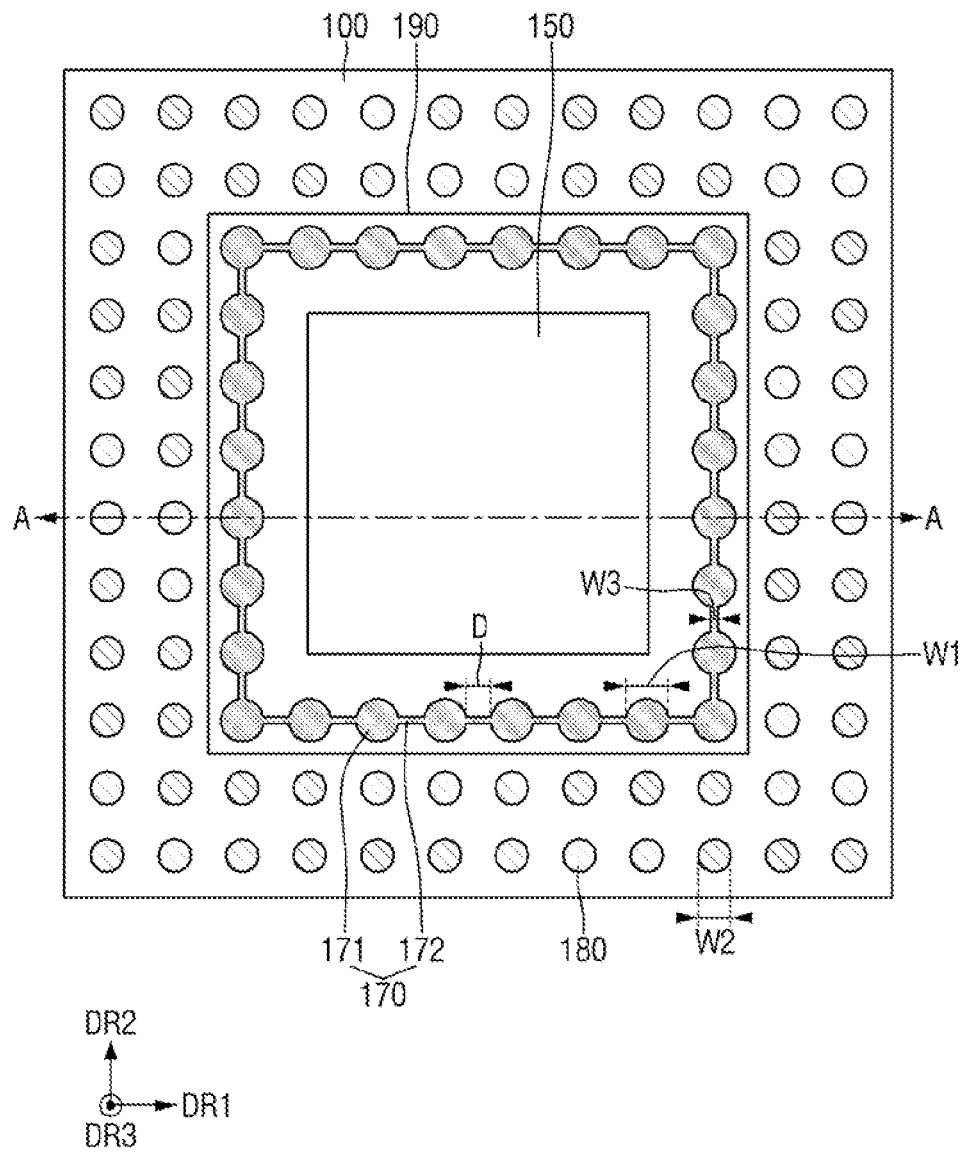
FIG. 1 is an exemplary layout diagram of a semiconductor package according to some embodiments.
Figure 2:
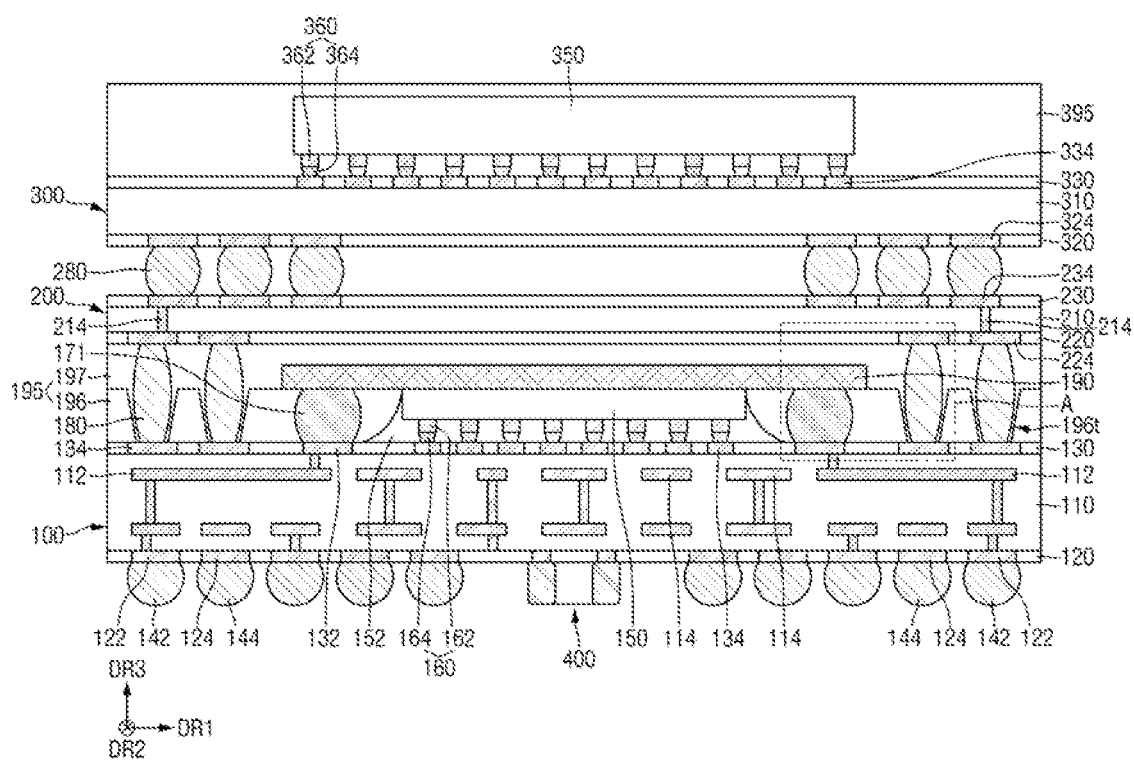
FIG. 2 is a schematic cross-sectional view taken along line A-A of FIG. 1.
Figure 3:
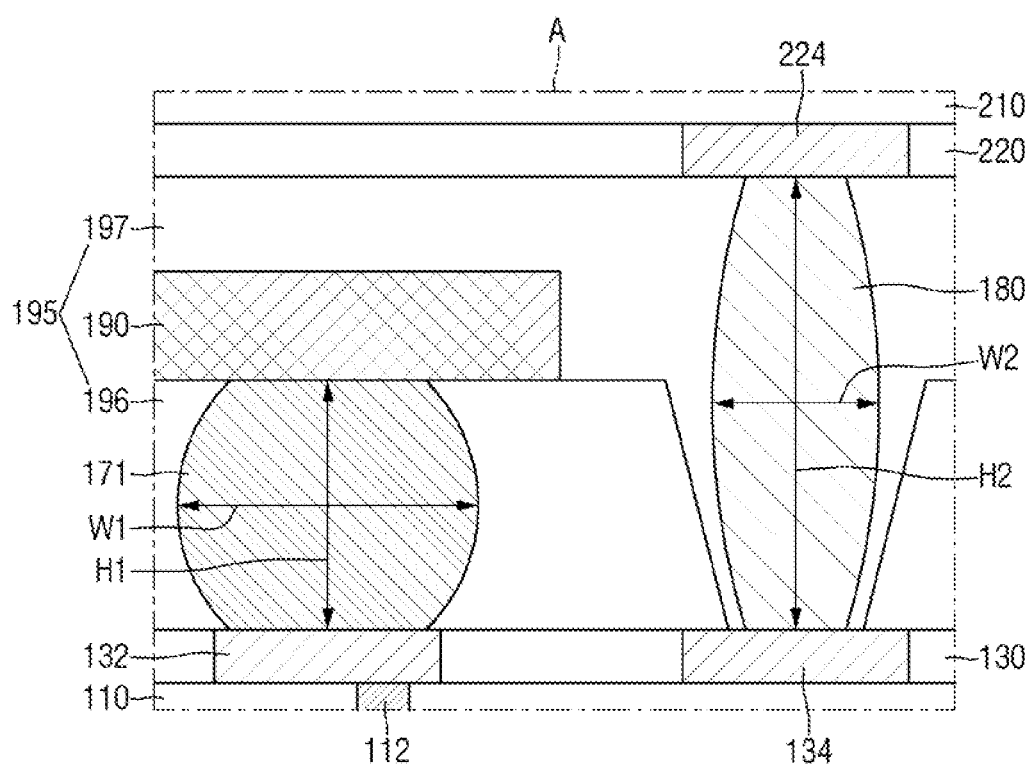
FIGS. 3 to 5 are various enlarged views of a region A of FIG. 2.
Figure 4:
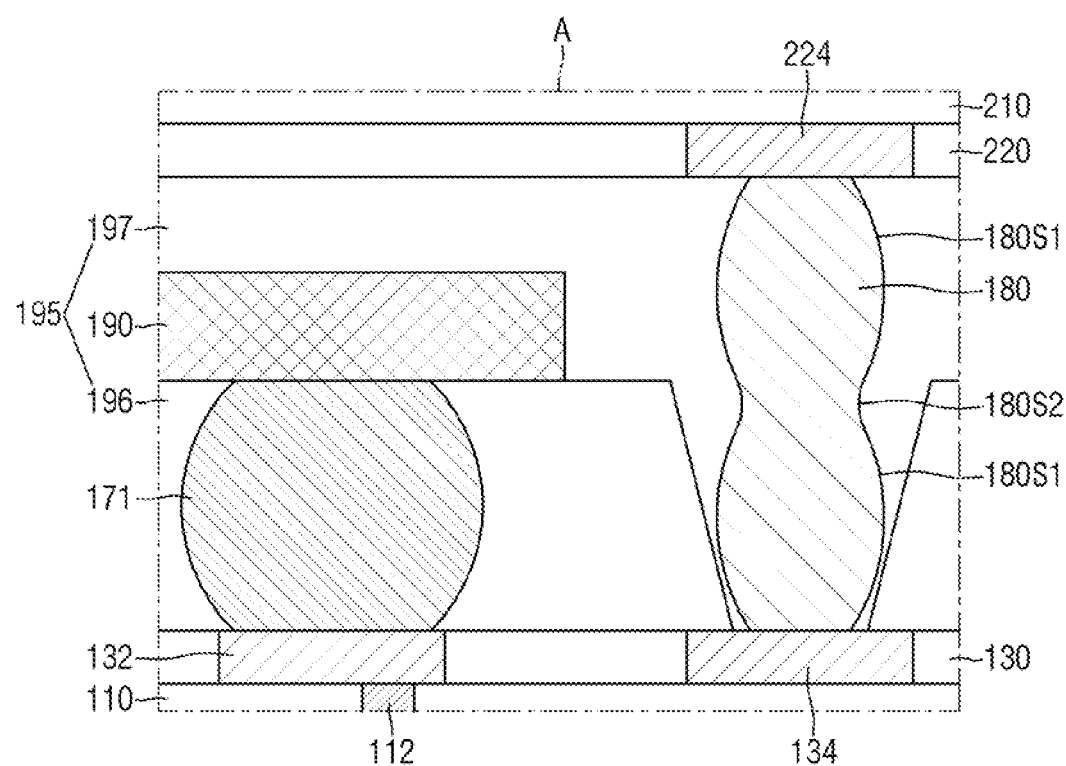
Figure 5:
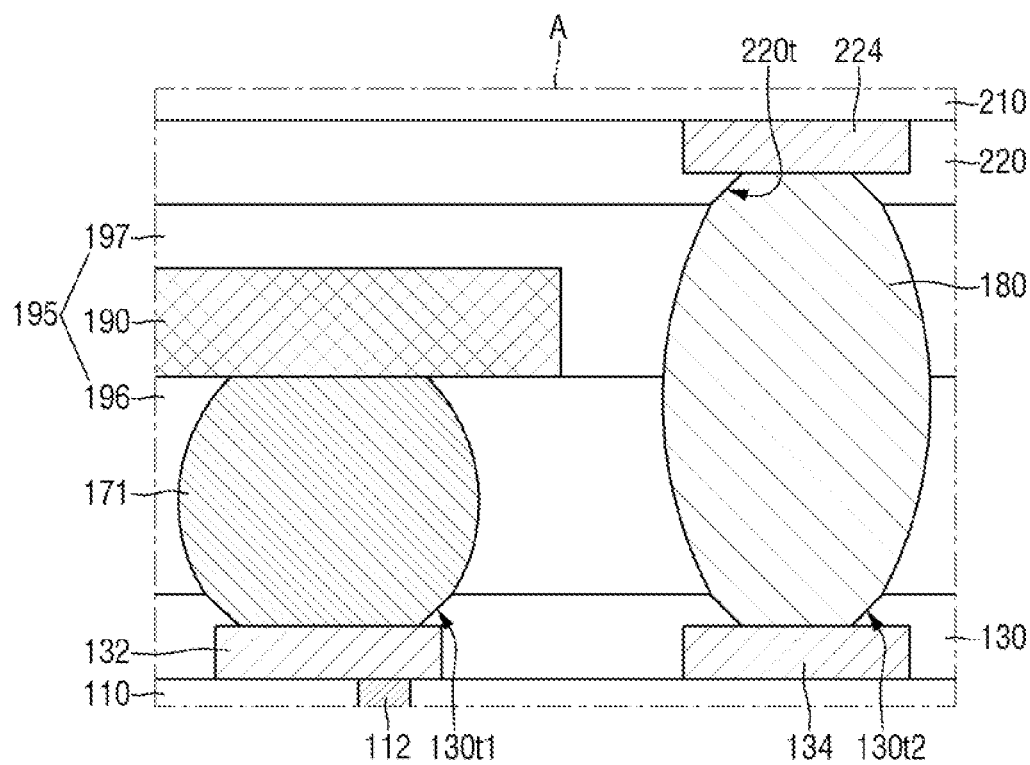

FIG. 1 is an exemplary layout diagram of a semiconductor package according to some embodiments. FIG. 2 is a schematic cross-sectional view taken along line A-A of FIG. 1. FIGS. 3 to 5 are various enlarged views of a region A of FIG. 2.

Referring to FIGS. 1 and 2, a semiconductor package according to some embodiments includes a first substrate 100, a ground terminal 142, an external terminal 144, a first semiconductor chip 150, a ball array structure 170, a first connection terminal 180, a shielding structure 190, a first molding film 195, an interposer 200, a second connection terminal 280, a second substrate 300, and a second semiconductor chip 350.

According to an embodiment, the first substrate 100 is a packaging substrate. For example, the first substrate 100 may be a printed circuit board (PCB) or a ceramic substrate, etc. The first substrate 100 may, of course, be a substrate for a wafer level package (WLP) fabricated at a wafer level. The first substrate 100 includes a lower surface and an upper surface that are opposite to each other.

According to an embodiment, the first substrate 100 includes a first insulating layer 110, a ground pattern 112, a first conductive pattern 114, a first lower passivation film 120, a lower ground pad 122, a first lower pad 124, a first upper passivation film 130, an upper ground pad 132, and a first upper pad 134.

According to an embodiment, the first insulating layer 110 and the ground pattern 112 in the first insulating layer 110 constitute a wiring pattern that electrically connect the lower ground pad 122 and the upper ground pad 132. The first insulating layer 110 and the first conductive pattern 114 in the first insulating layer 110 constitute a wiring pattern that electrically connects the first lower pad 124 and the first upper pad 134. Although the first insulating layer 110 is shown as a single layer, this is only for convenience of explanation, and embodiments are not limited thereto. For example, in other embodiments, the first insulating layer 110 includes multiple layers that include a multi-layered ground pattern 112 and a multi-layered first conductive pattern 114.

According to an embodiment, the first lower passivation film 120, the lower ground pad 122 and the first lower pad 124 are formed on the lower surface of the first insulating layer 110. The lower around pad 122 is electrically connected to the ground pattern 112. The first lower pad 124 is electrically connected to the first conductive pattern 114. The first lower passivation film 120 covers the lower surface of the first insulating layer 110, and includes openings that expose the lower ground pad 122 and the first lower pad 124.

According to an embodiment, the ground terminal 142 and the external terminal 144 are formed on the lower surface of the first substrate 100. The ground terminal 142 is attached to the lower ground pad 122, and the external terminal 144 is attached to the first lower pad 124. The ground terminal 142 and the lower ground pad 122 are disposed on the outermost part of the lower surface of the first substrate 100. A ground voltage is applied to the ground terminal 142, and a power supply voltage is applied to the external terminal 144.

According to an embodiment, the ground terminal 142 and the external terminal 144 may include, for example, but are not limited to, tin (Sn), indium (In), bismuth (Bi), antimony (Sb), copper (Cu), silver (Ag), zinc (Zn), lead (Pb), or combinations thereof.

According to an embodiment, a surface mounting element 400 is formed on the lower surface of the first substrate 100. The surface mounting element 400 is attached to the first lower pad 124. The surface mounting element 400 includes an element body, and a pair of external electrodes, each placed on a respective side of the element body. The surface mounting element 400 is electrically connected to the first substrate 100 and the first semiconductor chip 150 through the first lower pad 124.

According to an embodiment, the surface mounting element 400 may include various types of passive components and various shapes of surface-mountable components. The passive component may be, for example, an MLCC (Multi Layer Ceramic Capacitor), a LICC (Low Inductance Chip Capacitor), an LSC (Land Side Capacitor), an inductor, or an integrated passive device (IPD), etc.

According to an embodiment, the first upper passivation film 130, the upper ground pad 132 and first upper pad 134 are formed on the upper surface of the first insulating layer 110. The first upper passivation film 130 covers the upper surface of the first insulating layer 110, and includes openings that expose the upper ground pad 132 and the first upper pad 134.

According to an embodiment, the upper ground pad 132 is electrically connected to the lower ground pad 122, and the first upper pad 134 is electrically connected to the first lower pad 124. For example, the upper ground pad 132 is in contact with the ground pattern 112, and the first upper pad 134 is in contact with the first conductive pattern 114.

According to an embodiment, the first lower passivation film 120 and the first upper passivation film 130 include, for example, but are not limited to, a photoimageable dielectric (PID).

According to an embodiment, the first semiconductor chip 150 is placed on the first substrate 100. For example, the first semiconductor chip 150 is mounted on the upper surface of the first substrate 100. The first semiconductor chip 150 is an integrated circuit (IC) in which hundreds to millions or more semiconductor elements are integrated inside a single chip. For example, the first semiconductor chip 150 may be, but is not limited to, an application processor AP such as a CPU (Central Processing Unit), a GPU (Graphic Processing Unit), a FPGA (Field-Programmable Gate Array), a digital signal processor (DSP), an encryption processor, a micro processor, or a micro controller. For example, the first semiconductor chip 150 may be a logic chip such as an ADC (Analog-Digital Converter) or an ASIC (Application-Specific IC), or may also be a memory chip such as a volatile memory, such as a DRAM, or a non-volatile memory, such as a ROM or a flash memory. Also, the first semiconductor chip 150 may, of course, be configured by a combination thereof.

Although only one first semiconductor chip 150 is shown as being formed on the first substrate 100, this is only for convenience of explanation, and embodiments are not limited thereto. For example, a plurality of first semiconductor chips 150 may be formed side by side on the first substrate 100, or the plurality of first semiconductor chips 150 may be sequentially stacked on the first substrate 100.

According to an embodiment, the first semiconductor chip 150 is mounted on the first substrate 100 by, for example, flip chip bonding. A first bump 160 is formed between the upper surface of the first substrate 100 and the lower surface of the first semiconductor chip 150. The first bump 160 electrically connects the first substrate 100 and the first semiconductor chip 150.

According to an embodiment, the first bump 160 includes, for example, a first pillar layer 162 and a first solder layer 164.

According to an embodiment, the first pillar layer 162 protrudes from the lower surface of the first semiconductor chip 150. The first pillar layer 162 may include, for example, but is not limited to, copper (Cu), copper alloy, nickel (Ni), nickel alloy, palladium (Pd), platinum (Pt), gold (Au), cobalt (Co), or combinations thereof.

According to an embodiment, the first solder layer 164 connects the first pillar layer 162 and the first substrate 100. For example, the first solder layer 164 is connected to a part of the first upper pad 134. The first solder layer 164 may have, for example, but is not limited to, a spherical shape or an elliptical spherical shape. The first solder layer 164 may include, for example, but is not limited to, tin (Sn), indium (In), bismuth (Bi), antimony (Sb), copper (Cu), silver (Ag), zinc (Zn), lead (Pb), or combinations thereof.

According to an embodiment, an underfill 152 is formed on the first substrate 100. The underfill 152 fills a region between the first substrate 100 and the first semiconductor chip 150. The underfill 152 prevents breakage of the first semiconductor chip 150 by fixing the first semiconductor chip 150 onto the first substrate 100. The underfill 152 covers the first bump 160. The first bump 160 penetrates the underfill 152 to electrically connect the first substrate 100 and the first semiconductor chip 150.

According to an embodiment, the underfill 152 may include, but is not limited to, an insulating polymeric material such as an EMC. In some embodiments, the underfill 152 includes a material different from that of the first molding film 195. For example, the underfill 152 includes an insulating material having superior fluidity to the first molding film 195. As a result, the underfill 152 efficiently fills a narrow space between the first substrate 100 and the first semiconductor chip 150.

According to an embodiment, the ball array structure 170 is placed on the upper surface of the first substrate 100 and is spaced apart from the side walls of the first semiconductor chip 150. The ball array structure 170 extends along the perimeter of the first semiconductor chip 150 and has a closed-loop shape. For example, the ball array structure 170 is spaced apart from the first semiconductor chip 150 in the first direction DR1 and the second direction DR2 and surrounds the side walls of the first semiconductor chip 150. Alternatively, the first semiconductor chip 150 is placed in an internal region surrounded by the ball array structure 170, on the upper surface of the first substrate 100.

According to an embodiment, the ball array structure 170 includes a solder ball portion 171 and a connecting portion 172.

According to an embodiment, the solder ball portion 171 is arranged along the perimeter of the first semiconductor chip 150 on the upper surface of the first substrate 100. For example, the solder ball portion 171 are spaced apart in the first direction DR1 and the second direction DR2 from a first connection terminal 180 to be described below. At least a part of the solder ball portion 171 overlaps the first connection terminal 180 in the first direction DR1 and the second direction DR2.

According to an embodiment, the connecting portion 172 connects adjacent solder ball portions 171 to each other. For example, the connecting portion 172 connects adjacent solder ball portions 171 to each other in the first direction DR1 and/or the second direction DR2. Accordingly, the solder ball portions 171 are connected to each other by the connecting portion 172 to have a closed loop shape.

According to an embodiment, a maximum width W1 of the solder ball portion 171 differs from a width W3 of the connecting portion 172. Here, the width may mean a width in a direction parallel to the upper surface of the first substrate 100. For example, the maximum width W1 of the solder ball portion 171 in the first direction DR1 is greater than the width W3 of the connecting portion 172, and the maximum width of the solder ball portion 171 in the second direction DR2 is greater than the width W3 of the connecting portion 172. Here, the width W3 of the connecting portion 172 is measured in a direction perpendicular to the extension direction of the connecting portion 172 between adjacent solder ball portions 171.

According to an embodiment, a distance D between the adjacent solder ball portions 171 is less than the maximum width W1 of the solder ball portion 171. Alternatively, the shortest length D of the connecting portion 172 is less than the width W1 of the solder ball portion 171. For example, the distance D in the first direction DR1 between adjacent solder ball portions 171 is less than the maximum width W1 of the solder ball portion 171, and the distance D in the second direction DR2 between adjacent solder ball portions 171 is less than the maximum width W1 of the solder ball portion 171.

For example, according to an embodiment, the distance D between the adjacent solder ball portions 171 is less than 0.05 times the maximum width W1 of the solder ball portion 171. The maximum width W1 of the solder ball portion 171 is less than 500 μm, and the distance D between adjacent solder ball portions 171 is less than 25 μm.

According to an embodiment, at least a part of the ball array structure 170 is formed on the upper ground pad 132 of the first substrate 100. At least a part of the ball array structure 170 is in contact with the upper ground pad 132. The ball array structure 170 is electrically connected to the ground pattern 112 accordingly.

For example, according to an embodiment, the solder ball portion 171 of the ball array structure 170 is in contact with the upper ground pad 132, and the connecting portion 172 is electrically connected to the upper ground pad 132 through the solder ball portion 171. In still another example, at least part of the connecting portion 172 of the ball array structure 170 and/or the solder ball portion 171 of the ball array structure 170 is in contact with the upper ground pad 132.

According to an embodiment, the shielding structure 190 is placed on the upper surface of the first semiconductor chip 150 and on the upper surface of the ball array structure 170. The upper surface of the ball array structure 170 is substantially coplanar with the upper surface of a lower molding film 196 of the first molding film 195 and the upper surface of the first semiconductor chip 150. Accordingly, the shielding structure 190 is in contact with at least a part of the upper surface of the first semiconductor chip 150 and the upper surface of the ball array structure 170.

For example, according to an embodiment, the shielding structure 190 is in contact with both the upper surface of the first semiconductor chip 150 and the upper surface of the ball array structure 170, and covers both the upper surface of the first semiconductor chip 150 and the upper surface of the ball array structure 170. In other words, the shielding structure 190 entirely overlaps the ball array structure 170 in a third direction DR3. Alternatively, the shielding structure 190 is in contact with the upper surface of the first semiconductor chip 150 and is in contact with a part of the upper surface of the ball array structure 170. In other words, the shielding structure 190 overlaps a part of the ball array structure 170 in the third direction DR3.

Further, according to an embodiment, the ball array structure 170 is interposed between the first substrate 100 and the shielding structure 190. Accordingly, the shielding structure 190 is electrically connected to the ground pattern 112 through the ball array structure 170.

According to an embodiment, the shielding structure 190 may includes a metallic material. The shielding structure 190 includes for example, silver (Ag) or copper (Cu). Accordingly, the shielding structure 190 serves as a heat radiating member that radiates heat generated from the first semiconductor chip 150 out of the semiconductor package.

In a semiconductor package according to some embodiments, the ball array structure 170 and the shielding structure 190 ground and remove external electromagnetic waves, and the first semiconductor chip 150 is protected from external electromagnetic waves by the ball array structure 170 and the shielding structure 190. In addition, since the first semiconductor chip 150 is isolated by the ball array structure 170 and the shielding structure 190, electromagnetic interference is more efficiently blocked. Accordingly, it is possible to prevent damage or malfunction of the semiconductor package, and to ensure the operational reliability of the semiconductor package. Further, the ball array structure 170 and the shielding structure 190 also block internal electromagnetic waves from radiating out to prevent malfunctions of adjacent semiconductor devices or semiconductor packages.

On the other hand, a metal structure that encloses the semiconductor package can provide external electromagnetic waves. On the other hand, in a semiconductor package according to some embodiments, the upper surface of the first semiconductor chip 150 is shielded by the shielding structure 190, and the side surface of the first semiconductor chip 150 is shielded by the ball array structure 170. Therefore, the size of the semiconductor package can be reduced.

According to an embodiment, the interposer 200 is placed on the upper surface of the first substrate 100. The interposer 200 is interposed between the first substrate 100 and the second substrate 300. The interposer 200 is placed on the upper surface of the first semiconductor chip 150. The interposer 200 facilitates connection between the first substrate 100 and the second substrate 300. Further, the interposer 200 prevents warpage of the first substrate 100 and the second substrate 300.

According to an embodiment, the interposer 200 includes a lower surface and an upper surface opposite to each other. For example, the lower surface of the interposer 200 faces the upper surface of the first substrate 100, and the upper surface of the interposer 200 faces the lower surface of the second substrate 300.

According to an embodiment, the interposer 200 includes a second insulating layer 210, a second conductive pattern 214, a second lower passivation film 220, a second lower pad 224, a second upper passivation film 230, and a second upper pad 234.

According to an embodiment, the second insulating layer 210 and the second conductive pattern 214 in the second insulating layer 210 form a wiring pattern that electrically connects the second lower pad 224 and the second upper pad 234. Although the second insulating layer 210 is shown as a single layer, this is only for convenience of explanation, and embodiments are not limited thereto. For example, in other embodiments, the second insulating layer 210 includes multiple layers and includes the multi-layered second conductive pattern 214.

According to an embodiment, the second lower passivation film 220 and the second lower pad 224 are formed on the lower surface of the second insulating layer 210. The second lower passivation film 220 covers the lower surface of the second insulating layer 210 and includes an opening that exposes the second lower pad 224. The second lower pad 224 is electrically connected to the second upper pad 234. For example, the second lower pad 224 is in contact with the second conductive pattern 214.

According to an embodiment, the second upper passivation film 230 and the second upper pad 234 are formed on the upper surface of the second insulating layer 210. The second upper pad 234 is electrically connected to the second conductive pattern 214. The second upper passivation film 230 covers the upper surface of the second insulating layer 210, and includes an opening that exposes the second upper pad 234.

According to an embodiment, the second lower passivation film 220 and the second upper passivation film 230 include, for example, but are not limited to, a photoimageable dielectric (PID).

According to an embodiment, the first molding film 195 is formed on the upper surface of the first substrate 100. The first molding film 195 fills the region between the first substrate 100 and the interposer 200. The first molding film 195 includes a lower molding film 196 and an upper molding film 197.

According to an embodiment, the lower molding film 196 fills the space between the first substrate 100 and the shielding structure 190. The lower molding film 196 wraps the side surfaces of the first semiconductor chip 150 and the side surfaces of the ball array structure 170. The lower molding film 196 exposes the upper surface of the first semiconductor chip 150. The lower molding film 196 includes a molding film trench 196t. The molding film trench 196t exposes at least a part of the first upper pad 134.

According to an embodiment, the upper molding film 197 fills the region between the lower molding film 196, the shielding structure 190, and the interposer 200. The upper molding film 197 covers the shielding structure 190 and the lower molding film 196, and wraps the side surfaces of the first connection terminal 180.

According to an embodiment, the first molding film 195 includes, for example, but is not limited to, an insulating polymer material such as EMC (epoxy molding compound). The lower molding film 196 and the upper molding film 197 may include the same material or different materials.

According to an embodiment, the first connection terminals 180 are interposed between the first substrate 100 and the interposer 200. The first connection terminals 180 are in contact with the upper surface of the first substrate 100 and the lower surface of the interposer 200. The first connection terminals 180 electrically connect the first substrate 100 and the interposer 200. For example, the first connection terminals 180 are in contact with the first upper pads 134 exposed by the molding film trench 196t of the first substrate 100 and the second lower pad 224 of the interposer 200. As a result, the first connection terminals 180 electrically connect the first conductive pattern 114 and the second conductive pattern 214.

Referring to FIG. 3, according to an embodiment, a maximum width W1 of the solder ball portion 171 of the ball array structure 170 differs from a maximum width W2 of the first connection terminal 180. For example, the maximum width W1 of the solder ball portion 171 is greater than the maximum width W2 of the first connection terminal 180.

According to an embodiment, a height H1 of the solder ball portion 171 of the ball array structure 170 differs from a height H2 of the first connection terminal 180. Here, the height is measured in the third direction DR3, which is a thickness direction of the first substrate 100. The ball array structure 170 is interposed between the first substrate 100 and the shielding structure 190, the first connection terminal 180 is interposed between the first substrate 100 and the interposer 200, and the interposer 200 is placed on the shielding structure 190. Therefore, the height H1 of the solder ball portion 171 is less than the height H2 of the first connection terminal 180.

Referring to FIG. 4, according to an embodiment, the side surfaces of the first connection terminal 180 include convex portions 180S1, and a concave portion 180S2 which connects the convex portions 180S1. For example, the concave portion 180S2 is formed in a center portion of the side surface of the first connection terminal 180 and between the convex portions 180S1. In still another example, the concave portion 180S2 may be formed on the side surface of the first connection terminal 180 close to the first substrate 100, and may also be formed on the side surface of the first connection terminal 180 close to the interposer 200. The shape of the side surface of the first connection terminal 180 can vary depending on a method of fabricating a semiconductor package.

Referring to FIG. 5, according to an embodiment, the first upper passivation film 130 covers a part of the upper ground pad 132 and the first upper pad 134. The first upper passivation film 130 includes a first trench 130t1 that exposes a part of the upper ground pad 132, and a second trench 130t2 that exposes a part of the first upper pad 134.

According to an embodiment, the lower part, of the ball array structure 170 is formed in the first trench 130t1 and is electrically connected to the upper ground pad 132. A lower part of the solder ball portion 171 of the ball array structure 170 and/or a lower part of at least a part of the connecting portion 172 of the ball array structure 170 is formed inside the first trench 130t1. For example, the solder ball portion 171 is formed inside the first trench 130t1. The lower part of the first connection terminal 180 is formed in the second trench 130t2 and is electrically connected to the first upper pad 134.

According to an embodiment, the second lower passivation film 220 covers a part of the second lower pad 224. The second lower passivation film 220 includes a third trench 220t that exposes a part of the second lower pad 224.

According to an embodiment, an upper part of the first connection terminal 180 is formed in the third trench 220t and is electrically connected to the second lower pad 224.

Referring back to FIG. 2, according to an embodiment, the second substrate 300 is placed on the upper surface of the interposer 200. The second substrate 300 is a packaging substrate. For example, the second substrate 300 may be a printed circuit board (PCB), or a ceramic substrate, etc. Alternatively, the second substrate 300 may be a substrate for a wafer level package (WLP) fabricated at the wafer level. The second substrate 300 includes a lower surface and an upper surface opposite to each other. For example, the lower surface of the second substrate 300 faces the upper surface of the interposer 200.

According to an embodiment, the second substrate 300 includes a third insulating layer 310, a third lower passivation film 320, a third lower pad 324, a third upper passivation film 330, and a third upper pad 334.

According to an embodiment, the third insulating layer 310 and a conductive pattern in the third insulating layer 310 form a wiring pattern that electrically connects the third lower pad 324 and the third upper pad 334. Although the third insulating layer 310 is shown as a single layer, embodiments are not limited thereto. For example, in other embodiments, the third insulating layer 310 includes multiple layers and includes a multi-layered conductive pattern.

According to an embodiment, the third lower passivation film 320 and the third lower pad 324 are formed on the lower surface of the third insulating layer 310. The third lower passivation film 320 covers the lower surface of the third insulating layer 310 and includes an opening that exposes the third lower pad 324.

According to an embodiment, the third upper passivation film 330 and the third upper pad 334 are formed on the upper surface of the third insulating layer 310. The third upper passivation film 330 covers the upper surface of the third insulating layer 310, and includes an opening that exposes the third upper pad 334.

According to an embodiment, the third lower passivation film 320 and the third upper passivation film 330 include, for example, but are not limited to, a photoimageable dielectric (PID).

According to an embodiment, the second connection terminal 280 is interposed between the interposer 200 and the second substrate 300. The second connection terminal 280 is in contact with the upper surface of the interposer 200 and the lower surface of the second substrate 300. The second connection terminal 280 electrically connects the interposer 200 and the second substrate 300. For example, the second connection terminal 280 is in contact with the second upper pad 234 of the interposer 200 and the third lower pad 324 of the second substrate 300.

According to an embodiment, the second connection terminal 280 has, for example, but is not limited to, a spherical shape or an elliptical shape. The second connection terminal 280 may include, for example, but is not limited to is, tin (Sn), indium (In), bismuth (Bi), antimony (Sb), copper (Cu), silver (Ag) zinc (Zn), lead (Pb), or combinations thereof.

According to an embodiment, the second semiconductor chip 350 is placed on the second substrate 300. For example, the second semiconductor chip 350 is mounted on the upper surface of the second substrate 300. The second semiconductor chip 350 is an integrated circuit (IC) in which hundreds to millions or more semiconductor elements are integrated inside a single chip.

For example, according to an embodiment, the first semiconductor chip 150 may be a logic chip such as an application processor (AP), and the second semiconductor chip 350 may be a memory chip such as a volatile memory, such as DRAM, or a non-volatile memory, such as a ROM or a flash memory.

Although only one second semiconductor chip 350 is shown as being thrilled on the second substrate 300, embodiments are not limited thereto. For example, in other embodiments, a plurality of second semiconductor chips 350 may be formed side by side on the second substrate 300, or a plurality of second semiconductor chips 350 may be sequentially formed on the second substrate 300.

In some embodiments, the second semiconductor chip 350 is mounted on the second substrate 300 by flip chip bonding. For example, a second bump 360 is formed between the upper surface of the second substrate 300 and the lower surface of the second semiconductor chip 350. The second bump 360 electrically connects the second substrate 300 and the second semiconductor chip 350.

According to an embodiment, the second bump 360 includes, for example, a second pillar layer 362 and a second solder layer 364. Since the second pillar layer 362 and the second solder layer 364 are similar to the first pillar layer 162 and the first solder layer 164 described above, a repeated detailed description thereof will be omitted.

In some embodiments, a second molding film 395 is formed on the second substrate 300. The second molding film 395 covers and protects the second substrate 300, the second semiconductor chip 350, and the second bump 360. The second molding film 395 may include, but is not limited to, an insulating polymeric material such as an EMC.

Figure 6:
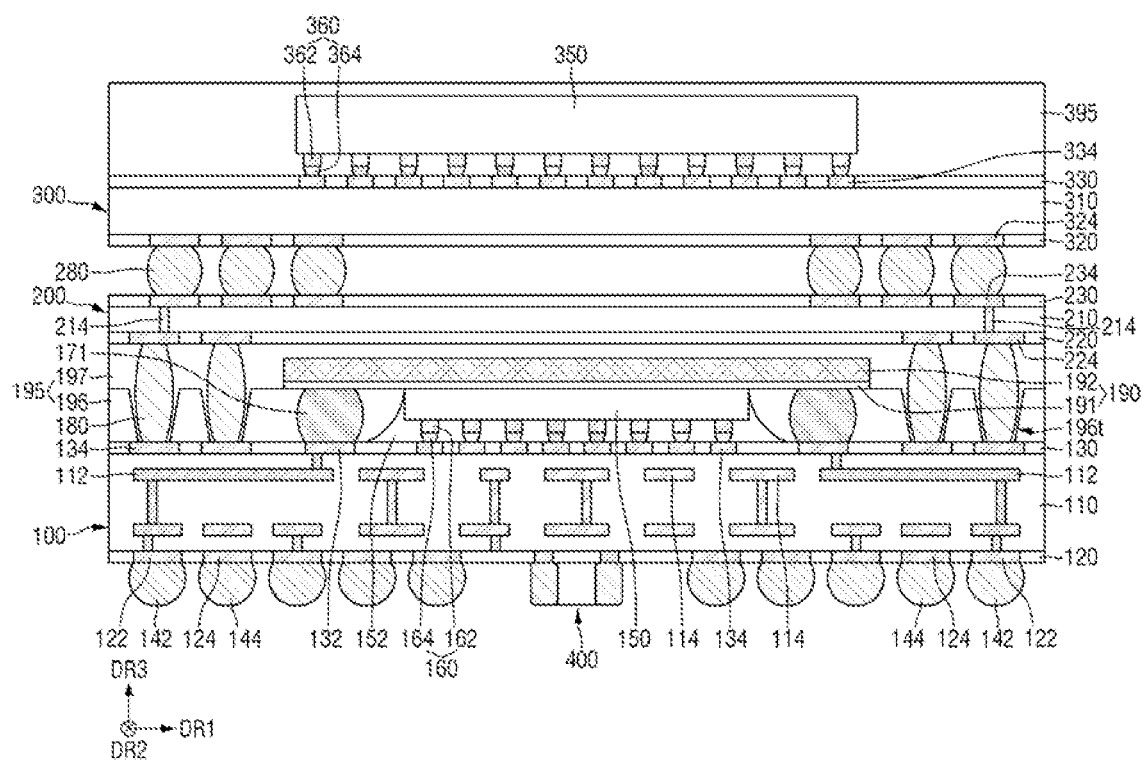
FIG. 6 is a schematic cross-sectional view of a semiconductor package according to some embodiments.

FIG. 6 is a schematic cross-sectional view of a semiconductor package according to some embodiments. For convenience of explanation, components described with reference to FIGS. 1 to 5 will be either briefly or not described.

Referring to FIG. 6, the shielding structure 190 of a semiconductor package according to some embodiments includes an adhesive layer 191 and a shielding layer 192.

According to an embodiment, the adhesive layer 191 is interposed between the upper surface of the lower molding film 196, the upper surface of the ball array structure 170 and the upper surface of the first semiconductor chip 150 exposed by the lower molding film 196, and the shielding layer 192. The adhesive layer 191 includes a conductive film. As a result, the shielding layer 192 is attached to the first semiconductor chip 150, the ball array structure 170, and the lower molding film 196 by the adhesive layer 191.

In addition, according to an embodiment, the adhesive layer 191 includes a heat transfer material. As a result, heat generated from the first semiconductor chip 150 may be released out through the adhesive layer 191 and/or the shielding layer 192.

According to an embodiment, the shielding layer 192 includes, for example, copper (Cu).

Although the adhesive layer 191 and the shielding layer 192 are shown as a single layer, embodiments are not limited thereto. For example, in other embodiments, the adhesive layer 191 and/or the shielding layer 192 may include multiple layers.

Figure 7:
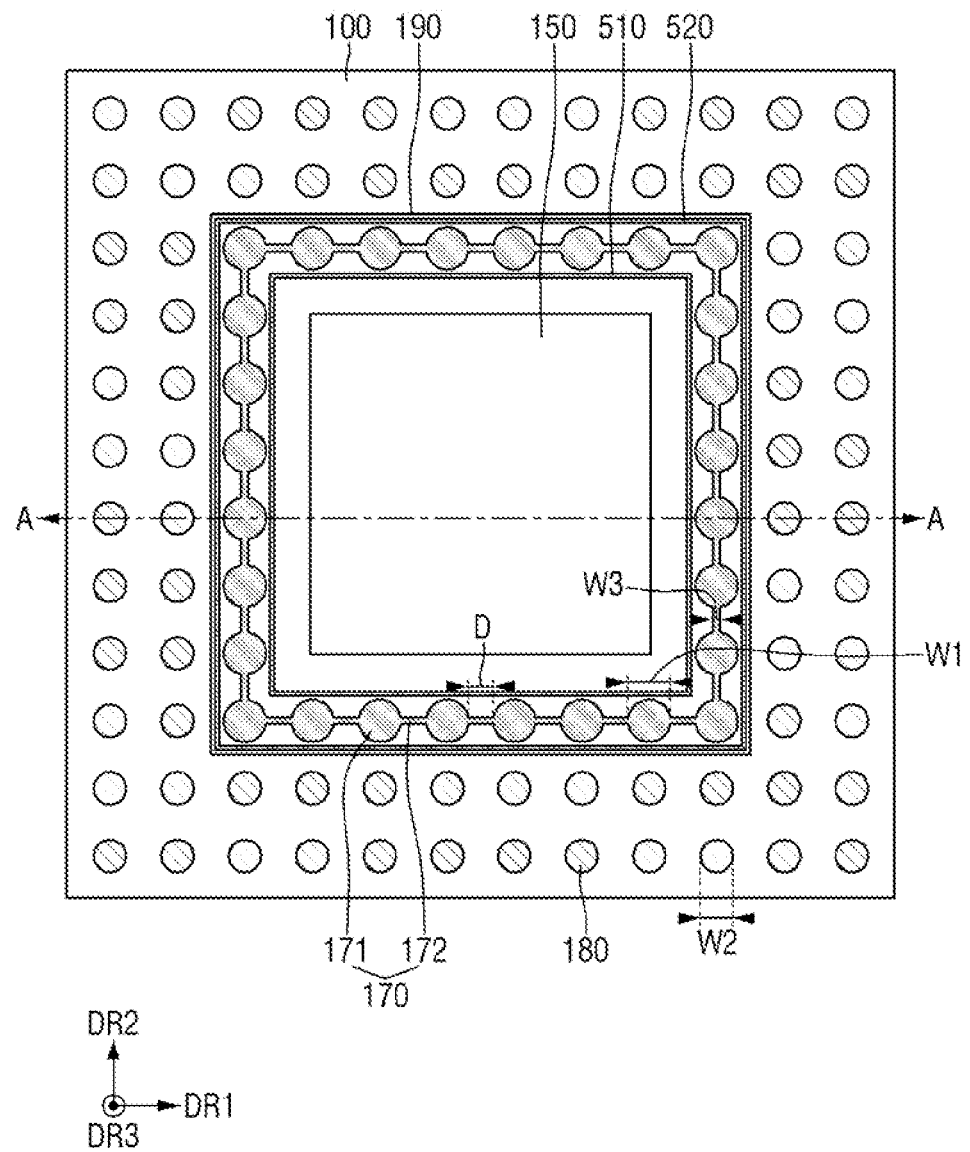
FIG. 7 is an exemplary layout diagram of a semiconductor package according to some embodiments.
Figure 8:
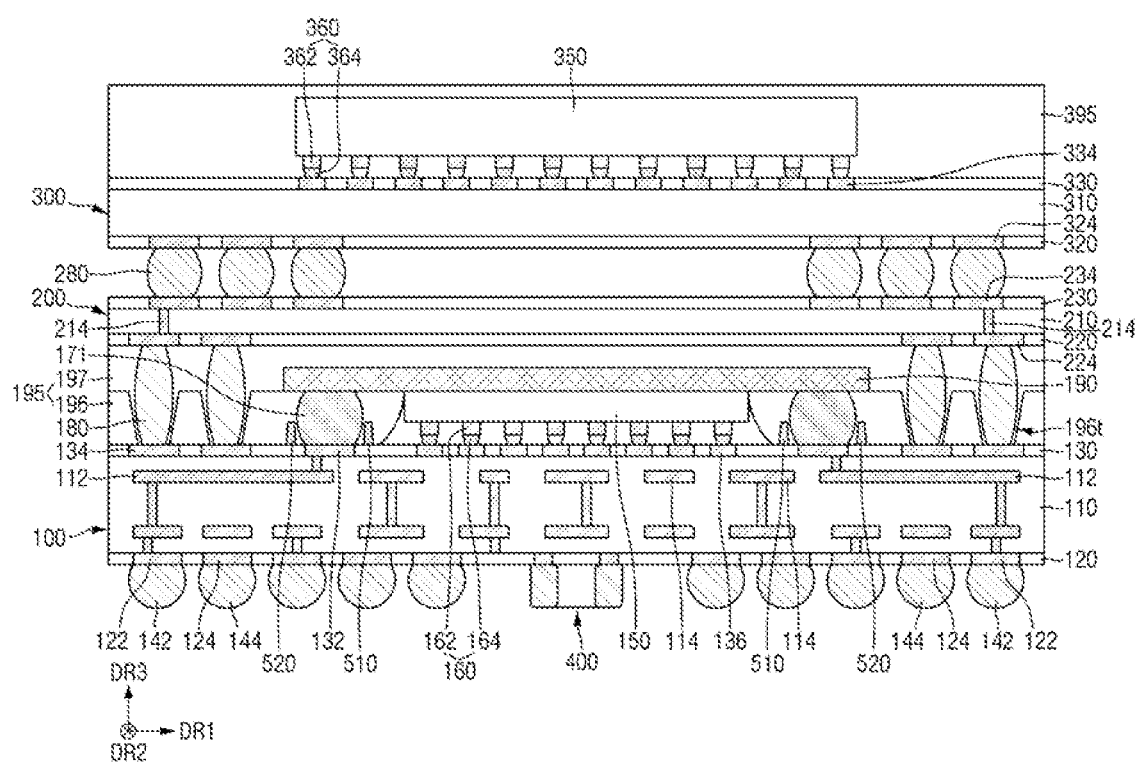
FIGS. 8 and 9 are schematic cross-sectional views taken along line A-A of FIG. 1.
Figure 9:
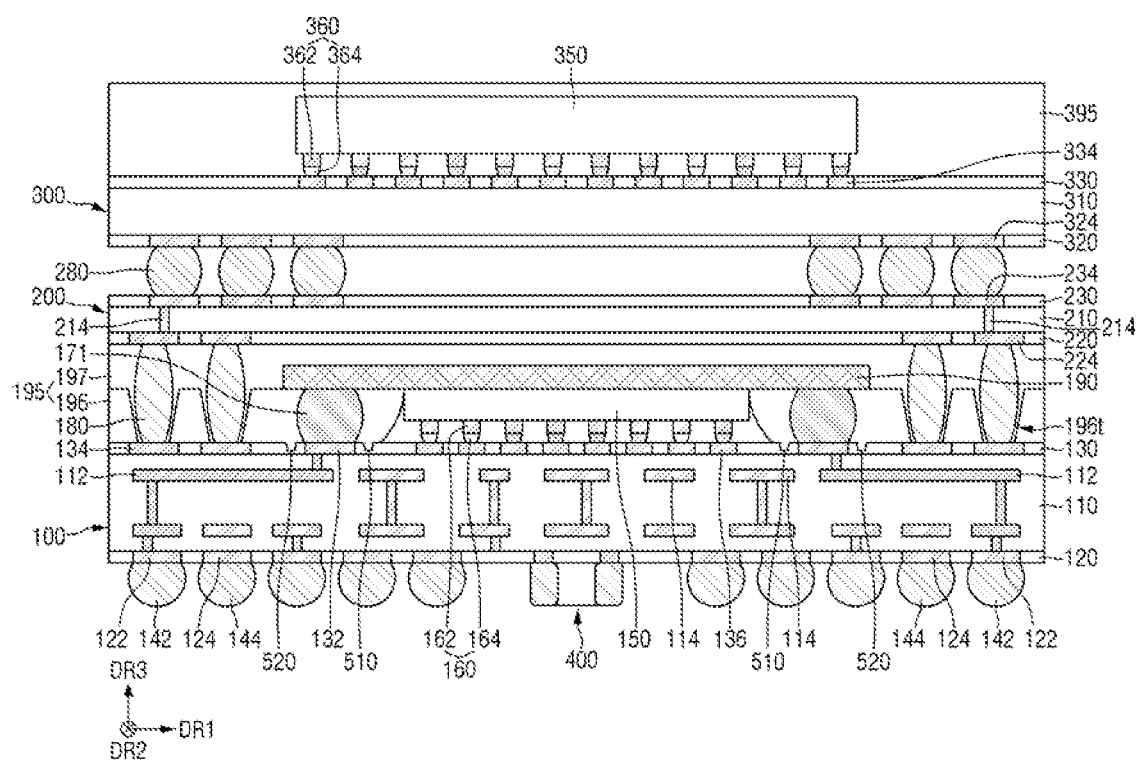

FIG. 7 is an exemplary layout diagram of a semiconductor package according to some embodiments. FIGS. 8 and 9 are schematic cross-sectional views taken along line A-A of FIG. 1. For convenience of explanation, components described with reference to FIGS. 1 to 5 will be either briefly or not described.

Referring to FIGS. 7 and 8, a semiconductor package according to some embodiments includes a first dam 510 and a second dam 520.

According to an embodiment, the first dam 510 is placed on the upper surface of the first substrate 100, between the first semiconductor chip 150 and the ball array structure 170. The first dam 510 is formed along the inner perimeter of the ball array structure 170 and is spaced apart from the ball array structure 170. For example, the first dam 510 is formed along the inner side of the ball array structure 170 and is spaced apart from the ball array structure 170 in the first direction DR1 and the second direction DR2.

According to an embodiment, the second dam 520 is placed on the upper surface of the first substrate 100, between the ball array structure 170 and the first connection terminal 180. The second dam 520 is formed along the outer perimeter of the ball array structure 170 and is spaced apart from the ball array structure 170. For example, the second dam 520 is formed along the outer side of the ball array structure 170 and is spaced apart from the ball array structure 170 in the first direction DR1 and the second direction DR2.

According to an embodiment, the ball array structure 170 is placed between the first dam 510 and the second dam 520. Referring to FIG. 8, the height of the first dam 510 and the second dam 520 in the third direction DR3 is less than the height of the ball array structure 170. The first dam 510 and the second dam 520 can prevent the ball array structure 170 from overflowing to the first connection terminal 180 and short-circuiting the first connection terminal 180.

Referring to FIG. 9, the first dam 510 and the second dam 520 in a semiconductor package according to some embodiments are engraved dams. That is, the first dam 510 and the second dam 520 are trenches formed in the upper surface of the first substrate 100. The first dam 510 and the second dam 520 expose at least a pan of the first upper passivation film 130 of the first substrate 100.

Although FIGS. 7 to 9 show both the first dam 510 and the second dam 520, embodiments are not limited thereto. For example, a semiconductor package according to some embodiments includes only one of the first dam 510 or the second dam 520.

Figure 10:
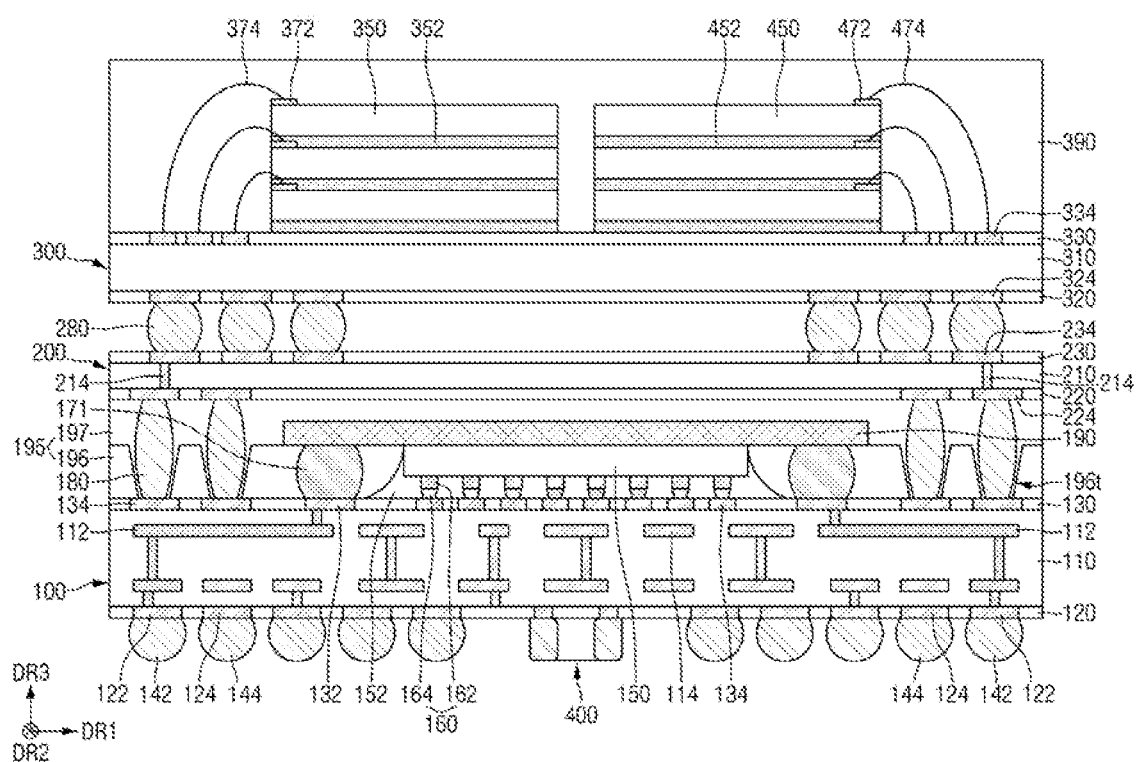
FIG. 10 is a schematic cross-sectional view of a semiconductor package according to some embodiments.

FIG. 10 is a schematic cross-sectional view of a semiconductor package according to some embodiments. For convenience of explanation, components described with reference to FIGS. 1 to 5 will be either briefly described or not described.

Referring to FIG. 10, a semiconductor package according to some embodiments includes second semiconductor chips 350 and third semiconductor chips 450. The second semiconductor chips 350 and the third semiconductor chips 450 are stacked in the third direction DR3 and form a stacked structure. The number of stacked structures and the number of semiconductor chips that form the stacked structure may vary.

For example, according to an embodiment, the first semiconductor chip 150 is a logic chip, and the second semiconductor chips 350 and the third semiconductor chips 450 are memory chips.

According to an embodiment, the second semiconductor chips 350 are mounted on the second substrate 300 by a first adhesion layer 352. The third semiconductor chips 450 are mounted on the second substrate 300 by a second adhesion layer 452. The first adhesion layer 352 and the second adhesion layer 452 may include, for example, but are not limited to, at least one of a liquefied epoxy, an adhesive tape, a conductive medium, or a combination thereof.

According to an embodiment, the second semiconductor chips 350 are electrically connected to the second substrate 300 by a first bonding wire 374. For example, the first bonding wire 374 connects a first chip pad 372 located at an edge of each second semiconductor chip 350 to the third upper pad 334 of the second substrate 300. The third semiconductor chips 450 are electrically connected to the second substrate 300 by a second bonding wire 474. For example, the second bonding wire 474 connects a second chip pad 472 located at an edge of each third semiconductor chip 450 to the third upper pad 334 of the second substrate 300. However, embodiments of the present inventive concept are not limited thereto, and other embodiments, the second semiconductor chips 350 and/or the third semiconductor chips 450 are electrically connected to the third upper pad 334 by, for example, a bonding tape, etc.

Figure 11:
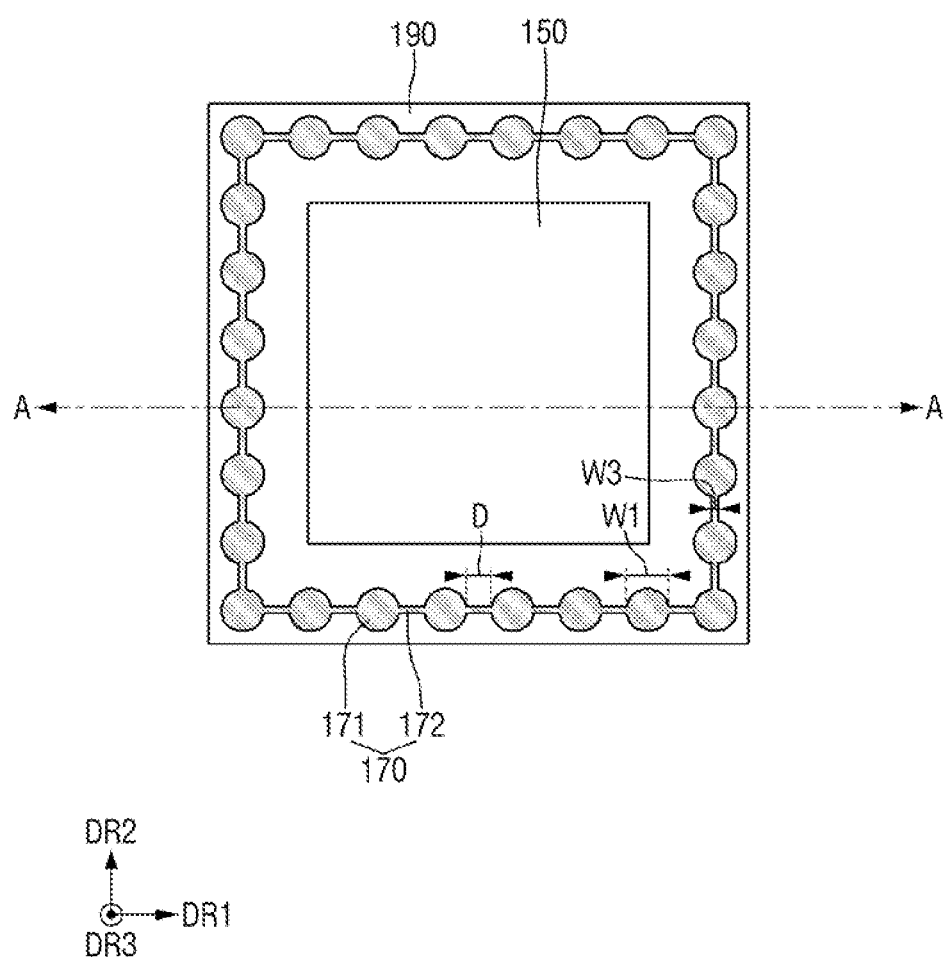
FIG. 11 is an exemplary layout diagram of a semiconductor package according to some embodiments.
Figure 12:
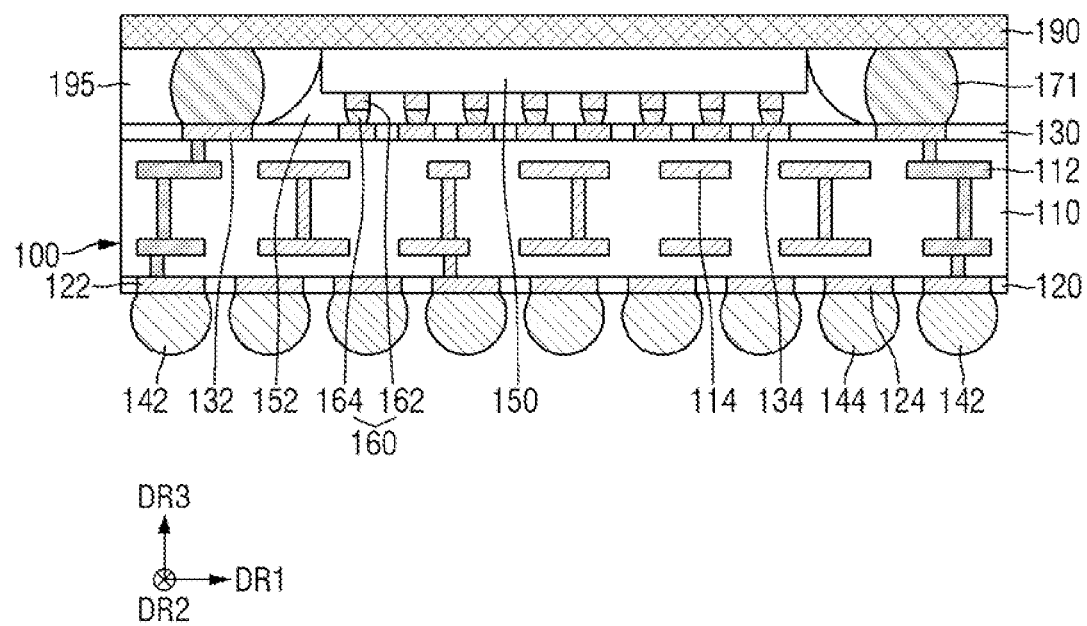
FIGS. 12 and 13 are schematic cross-sectional views taken along line A-A of FIG. 11.
Figure 13:
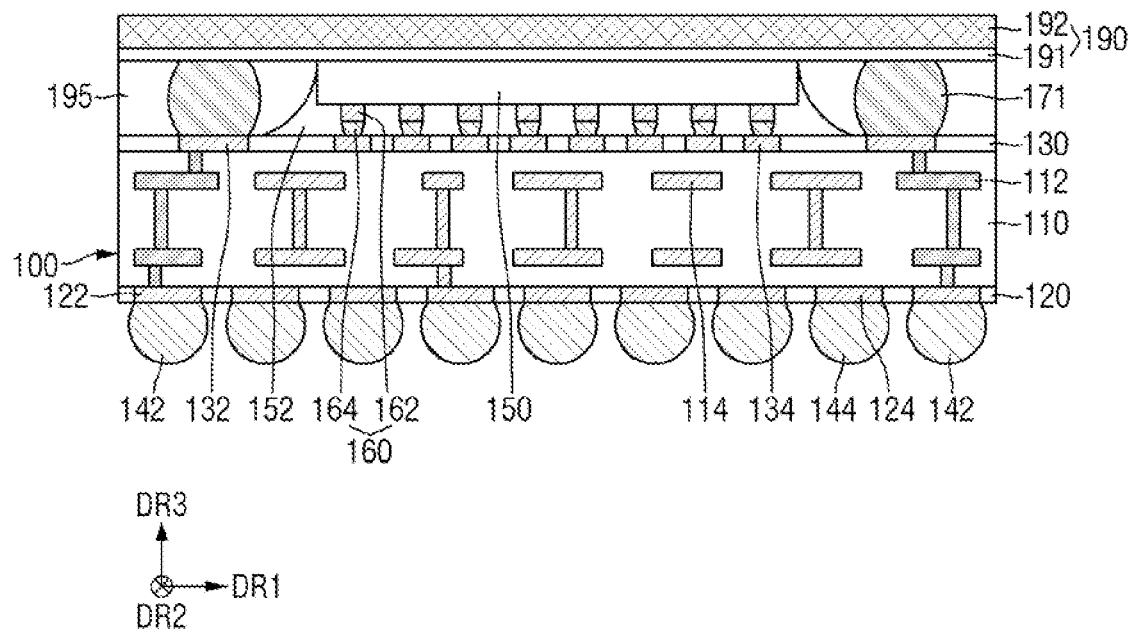

FIG. 11 is an exemplary layout diagram of a semiconductor package according to some embodiments. FIGS. 12 and 13 are schematic cross-sectional views taken along line A-A of FIG. 11. For convenience of explanation, components described with reference to FIGS. 1 to 5 will be either briefly described or not described.

Referring to FIGS. 11 and 12, a semiconductor package according to some embodiments includes a first substrate 100, a ground terminal 142, an external terminal 144, a first semiconductor chip 150, and a ball array structure 170, a shielding structure 190, and a molding film 195.

According to an embodiment, the ball array structure 170 is in contact with the upper ground pad 132 exposed by the first upper passivation film 130. Accordingly, the ball array structure 170 is electrically connected to the ground pattern 112.

According to an embodiment, the shielding structure 190 is in contact with the upper surface of the first semiconductor chip 150, the upper surface of the ball array structure 170, and the upper surface of the molding film 195. Accordingly, the shielding structure 190 is electrically connected to the ground pattern 112 through the ball array structure 170. In addition, a length of the shielding structure 190 is substantially equal to a length of the first substrate 100.

According to an embodiment, the shielding structure 190 includes a metallic material. The shielding structure 190 includes, for example, silver (Ag) or copper (Cu).

According to an embodiment, the molding film 195 fills the space between the upper surface of the first substrate 100 and the shielding structure 190. The molding film 195 wraps the side surface of the first semiconductor chip 150, the side surface of the underfill 152, and the side surface of the ball array structure 170. The side surface of the molding film 195 is substantially coplanar with the side surface of the first substrate 100.

Referring to FIGS. 11 and 13, the shielding structure 190 of a semiconductor package according to some embodiments includes an adhesive layer 191 and a shielding layer 192.

According to an embodiment, the shielding layer 192 is attached to the first semiconductor chip 150, the ball array structure 170, and the lower molding film 196 by the adhesive layer 191.

According to an embodiment, the adhesive layer 191 includes a heat transfer material, and the shielding layer 192 includes, for example, copper (Cu).

Figure 14:
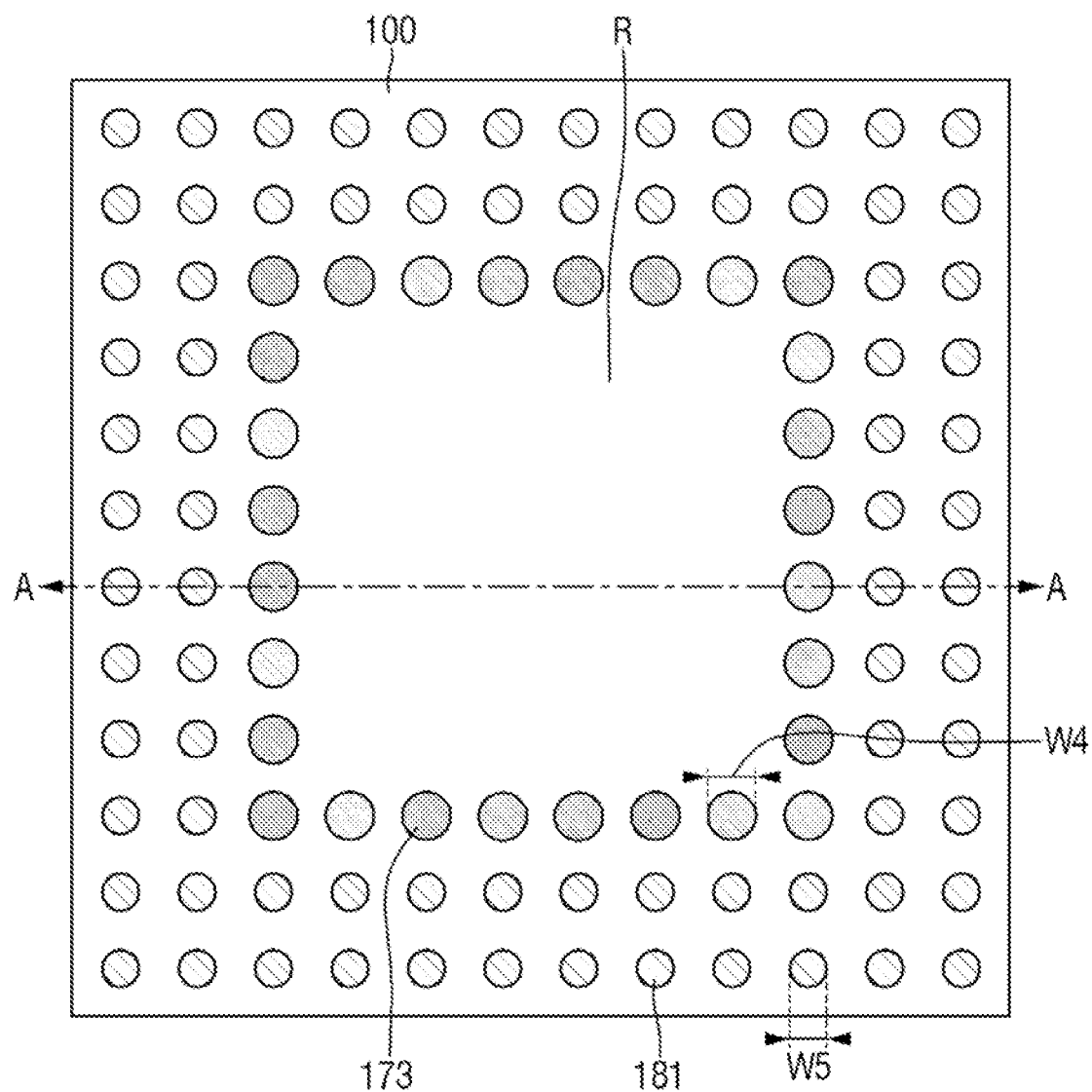
FIGS. 14 to 22 illustrate intermediate stages of a method of fabricating a semiconductor package according to some embodiments.
Figure 15:
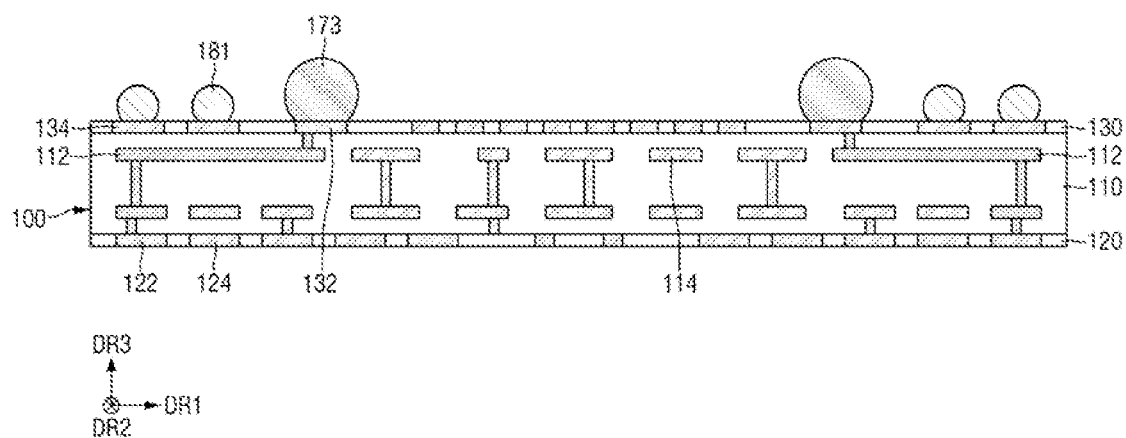

FIGS. 14 to 22 illustrate intermediate stages of a method of fabricating a semiconductor package according to some embodiments. FIG. 15 is a cross-sectional view taken along a line A-A of FIG. 14, and FIGS. 17 to 22 are cross-sectional views taken along a line A-A of FIG. 16. Cross section A-A of FIG. 14 correspond to cross section A-A of FIG. 16.

Referring to FIGS. 14 and 15, according to an embodiment, the first substrate 100 is provided. The first substrate 100 includes the first insulating layer 110, the ground pattern 112, the first conductive pattern 114, the first lower passivation film 120, the lower ground pad 122, the first lower pad 124, the first upper passivation film 130, the upper ground pad 132, and the first upper pad 134.

According to an embodiment, first solder balls 173 and second solder balls 181 are disposed on the upper surface of the first substrate 100. The first solder balls 173 are disposed on the upper ground pads 132 that are exposed by the first upper passivation film 130. The second solder balls 181 are disposed on the first upper pads 134 that are exposed by the first upper passivation film 130. The first solder balls 173 overlap the second solder balls 181 in the first direction DR1 and the second direction DR2.

According to an embodiment, a maximum width W4 of the first solder balls 173 is greater than a maximum width W5 of the second solder balls 181. A height of the first solder balls 173 in the third direction DR3 is less than a height of the second solder balls 181.

According to an embodiment, the upper ground pads 132 are arranged around a central region R. The region R is defined by the arrangement of the upper ground pads 132. Accordingly, the first solder balls 173 are arranged around the region R.

Figure 16:
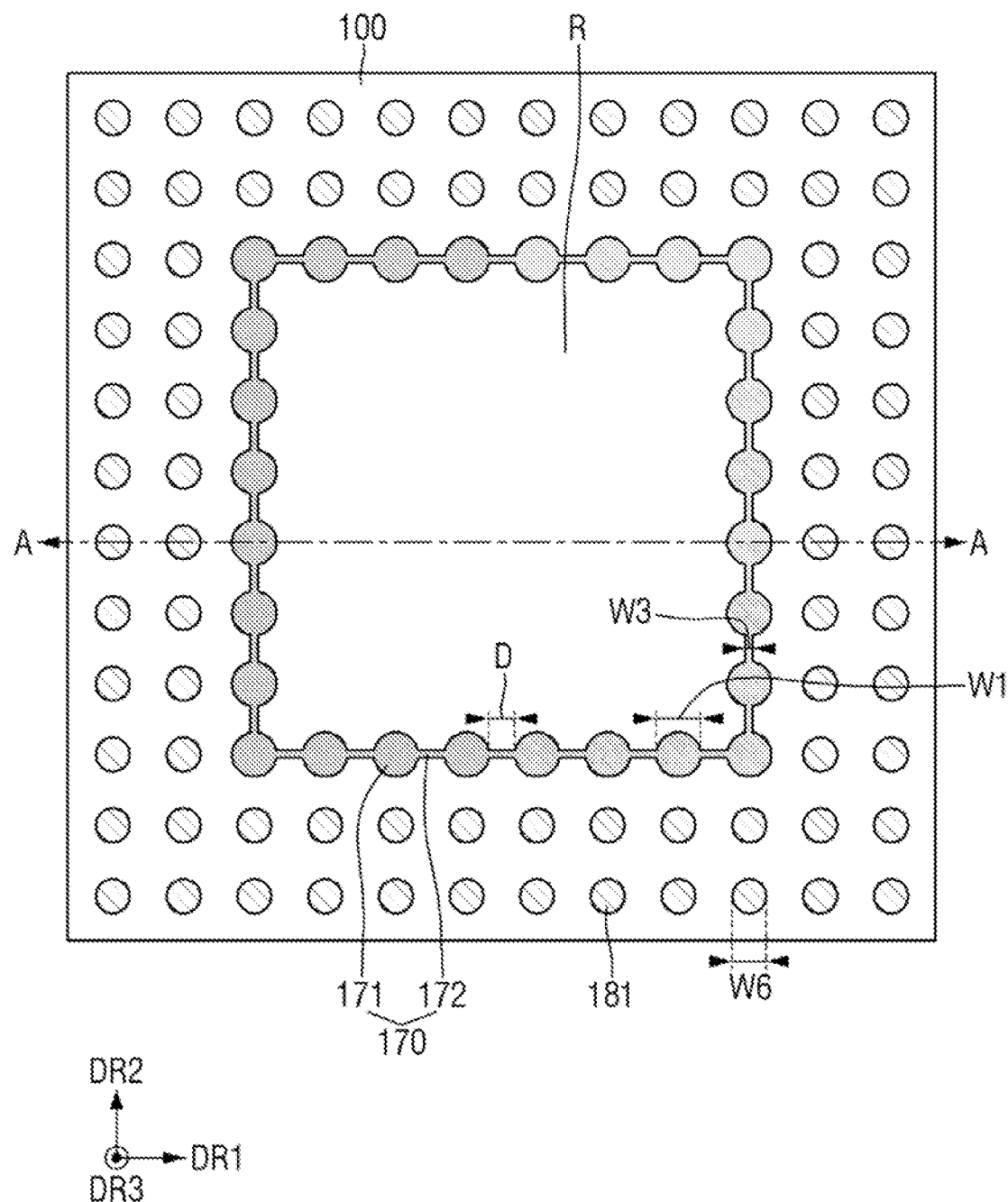

Referring to FIG. 16, according to an embodiment, a ball array structure 170 is formed by a reflow process. The ball array structure 170 includes a solder ball portion 171 and a connecting portion 172 that connects the solder ball portion 171. The ball array structure 170 has a closed loop shape. Therefore, the ball array structure 170 is attached onto the upper surface of the first substrate 100. In addition, the ball array structure 170 is electrically connected to the ground pattern 112.

According to an embodiment, a distance D between adjacent solder ball portions 171 is less than 0.05 times the maximum width W1 of the solder ball portion 171. The maximum width W1 of the solder ball portion 171 is less than about 500 μm, and the distance D between adjacent solder ball portions 171 is less than about 25 μm.

According to an embodiment, the second solder ball 181 is attached onto the upper surface of the first substrate 100 by a reflow process. A maximum width W6 of the second solder ball 181 is less than the maximum width W1 of the solder ball portion 171.

Figure 17:
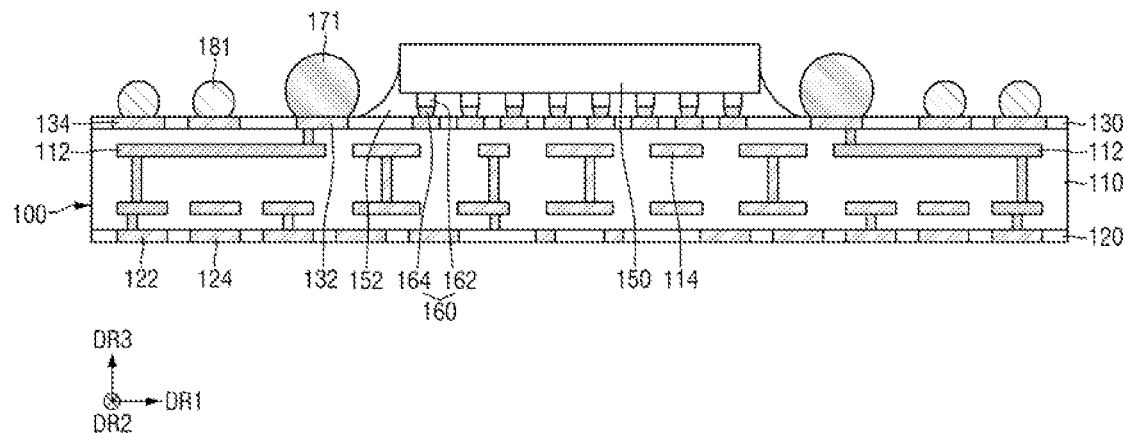

Referring to FIG. 17, according to an embodiment, the first semiconductor chip 150 is disposed on the region R of the upper surface of the first substrate 100. The first semiconductor chip 150 is electrically connected to the first upper pad 134 by the first bump 160, which includes the first pillar layer 162 and the first solder layer 164. Accordingly, the first semiconductor chip 150 is disposed inside the ball array structure 170.

According to an embodiment, an underfill 152 is formed on the first substrate 100. The underfill 152 fills a region between the first substrate 100 and the first semiconductor chip 150, and wraps the side surfaces of the first bump 160.

Figure 18:
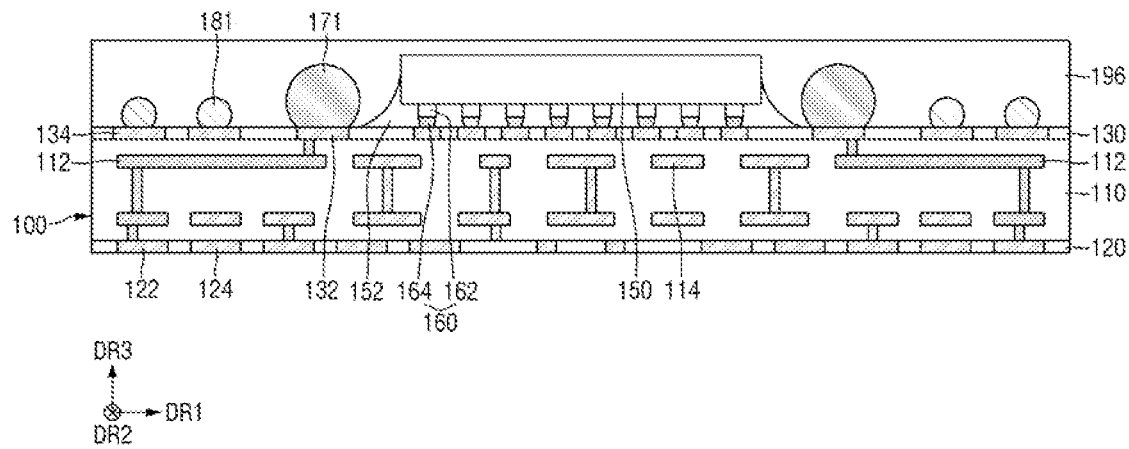

Referring to FIG. 18, according to an embodiment, a lower molding film 196 is formed on the upper surface of the first substrate 100. The lower molding film 196 covers the ball array structure 170, the second solder ball 181, and the first semiconductor chip 150. That is, the lower molding film 196 covers the upper surface of the first semiconductor chip 150.

Figure 19:
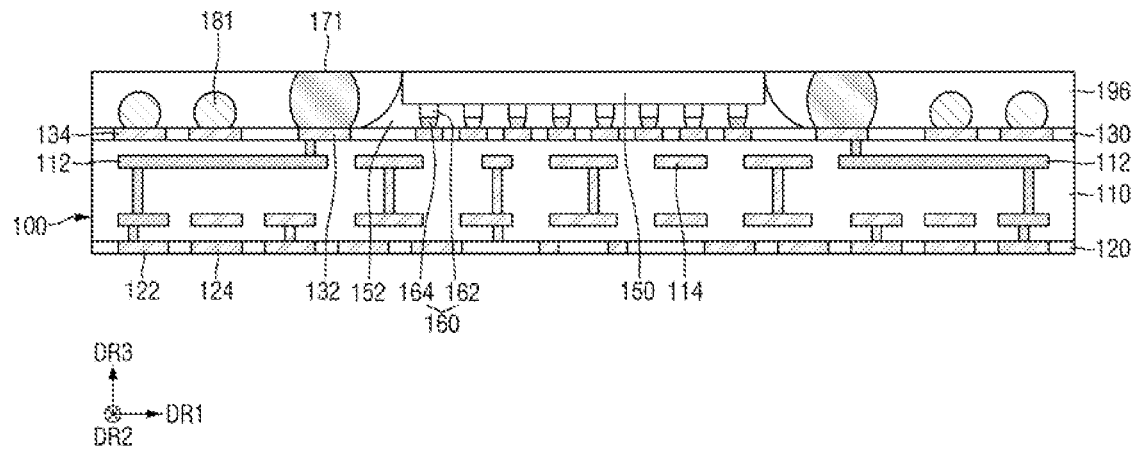

Referring to FIG. 19, according to an embodiment, the lower molding film 196 is etched. The lower molding film 196 is etched so that the upper surface of the first semiconductor chip 150 and the upper surface of the ball array structure 170 are exposed. That is, a part of the first semiconductor chip 150 and a part of the ball array structure 170 are etched together with the lower molding film 196. Accordingly, the upper surface of the lower molding film 196 is substantially coplanar with the upper surface of the first semiconductor chip 150 and the upper surface of the ball array structure 170.

Figure 20:
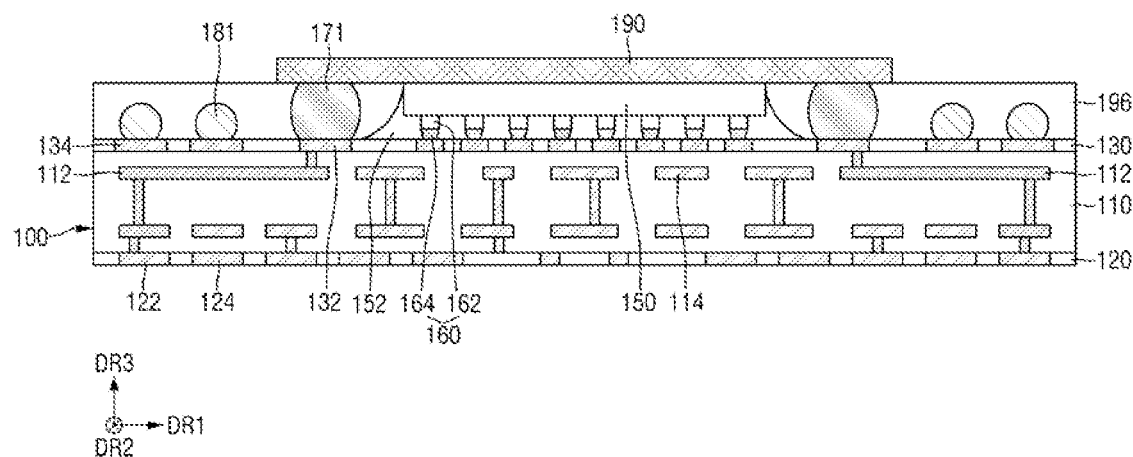

Referring to FIG. 20, according to an embodiment, the shielding structure 190 is formed on the lower molding film 196, the first semiconductor chip 150, and the ball array structure 170. The shielding structure 190 completely covers the solder ball portion 171. As a result, the shielding structure 190 is in contact with and electrically connected to the ball array structure 170. Further, the first semiconductor chip 150 is isolated by the ball array structure 170 and the shielding structure 190.

According to an embodiment, the shielding structure 190 is attached onto the lower molding film 196, the first semiconductor chip 150 and the ball array structure 170 by a process such as screen printing or sputtering, or a conductive adhesive film, etc.

Figure 21:
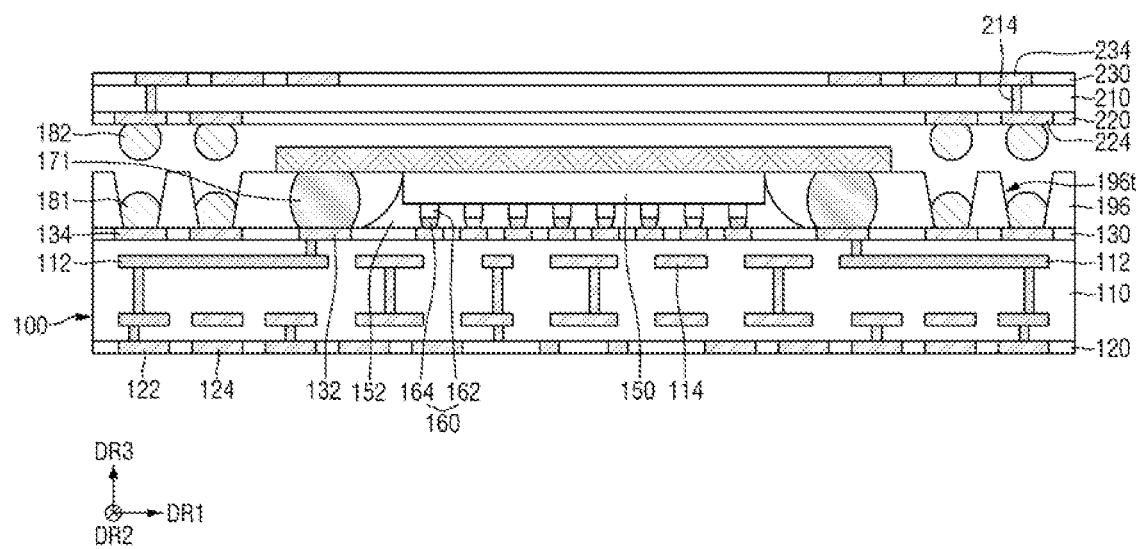

Referring to FIG. 21, according to an embodiment, a molding film trench 196t that exposes at least a part of the upper surface of the first upper pad 134 is formed. For example, the molding film trench 196t is formed by laser drilling and penetrates the lower molding film 196.

According to an embodiment, an interposer 200 is provided. The interposer 200 includes the second insulating layer 210, the second conductive pattern 214, the second lower passivation film 220, the second lower pad 224, the second upper passivation film 230, and the second upper pad 234. Third solder balls 182 are formed on the lower surface of the interposer 200. The third solder balls 182 are formed on the second lower pad 224 exposed by the second lower passivation film 220. The third solder balls 182 are formed at positions that correspond to the second solder balls 181.

According to an embodiment, the interposer 200 is disposed on the upper surface of the first substrate 100 so that the third solder balls 182 correspond to the second solder balls 181.

Figure 22:
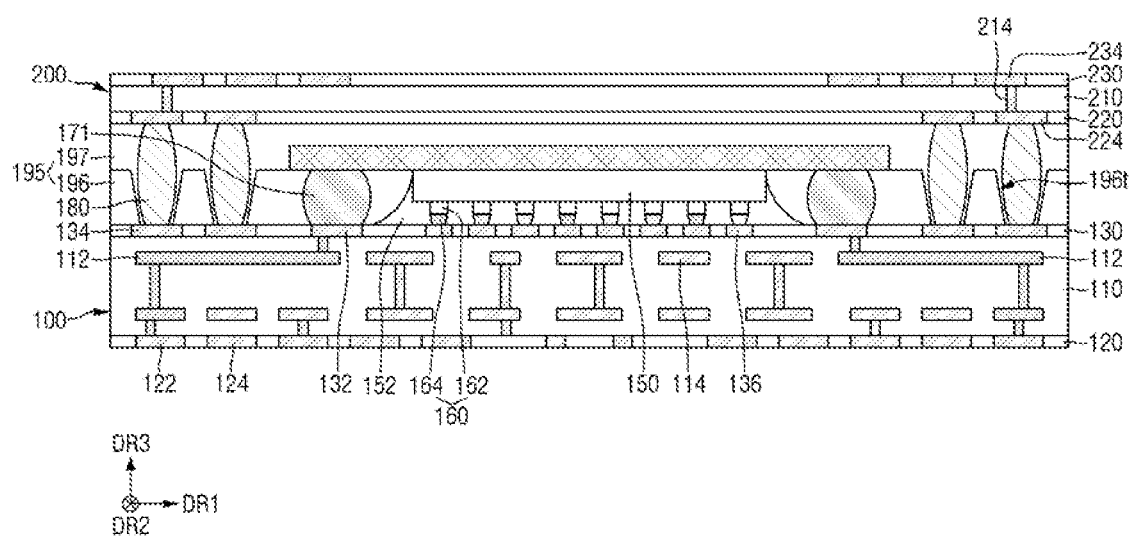

Referring to FIG. 22, according to an embodiment, the second solder balls 181 and the third solder balls 182 are connected by a reflow process to form the first connection terminal 180. Referring to FIGS. 1 and 2, the maximum width W2 of the first connection terminal 180 is less than the maximum width W1 of the solder ball portion 171.

Figure 24:
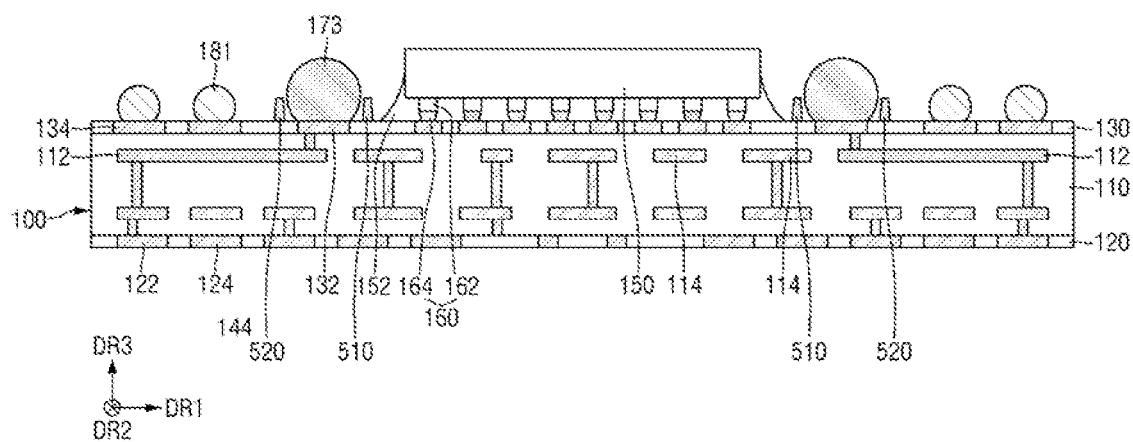
Figure 25:
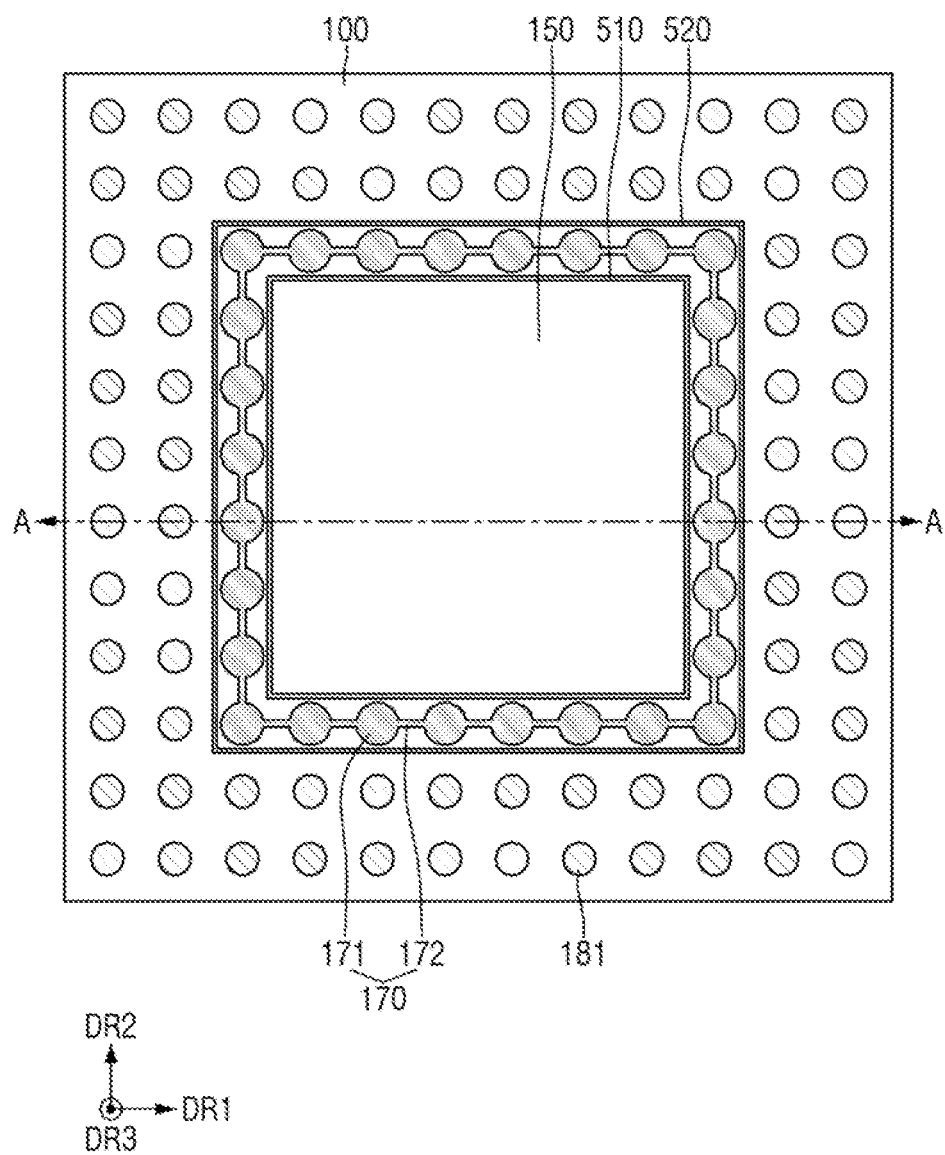

FIGS. 23 to 25 illustrate intermediate stages of a method of fabricating a semiconductor package according to some embodiments. FIG. 24 is a cross-sectional view taken along a line A-A of FIG. 23. Cross section A-A of FIG. 25 corresponds to cross section A-A of FIG. 23. For convenience of explanation, components described with reference to FIGS. 14 to 21 will be either briefly described or not described.

Referring to FIGS. 23 and 24, according to an embodiment, the first dam 510 and the second dam 520 are formed on the upper surface of the first substrate 100. The first dam 510 is arranged around the region R. The region R is defined by the first dam 510. The second dam 520 is spaced apart from the first dam 510.

Subsequently, according to an embodiment, the first solder balls 173 and the second solder balls 181 are disposed on the upper surface of the first substrate 100. The first solder balls 173 are disposed between the first dam 510 and the second dam 520. The second solder balls 181 are disposed outside the second dam 520.

Referring to FIG. 25, according to an embodiment, a ball array structure 170 is formed by a reflow process. The ball array structure 170 includes a solder ball portion 171 and a connecting portion 172 for connecting the solder ball portion 171. The ball array structure 170 has a closed loop shape.

At this time, the first solder ball 173 melted by the reflow process does not overflow to the surroundings due to the first dam 510 and the second dam 520. As a result, it is possible to prevent the second solder ball 181 from being short-circuited.

In concluding the detailed description, those skilled in the art will appreciate that many variations and modifications may be made to embodiments without substantially departing from the principles of the present inventive concept. Therefore, embodiments of the inventive concept are used in a generic and descriptive sense only and not for purposes of limitation.

What is claimed is:

1. A semiconductor package, comprising:
   a first substrate that includes a first insulating layer, a ground pattern in the first insulating layer, and a first conductive pattern;
   a first semiconductor chip placed on an upper surface of the first substrate;
   a ball array structure that is placed on the upper surface of the first substrate, is electrically connected to the ground pattern, extends along a perimeter of the first semiconductor chip and is spaced apart from side walls of the first semiconductor chip; and
   a shielding structure that is in contact with an upper surface of the first semiconductor chip, is in contact with at least a part of an upper surface of the ball array structure and is not in contact with side surfaces of the ball array structure,
   wherein the ball array structure has a closed loop shape, and includes a solder ball portion and a connecting portion that connects adjacent solder ball portions, and
   a maximum width in a first direction parallel to the upper surface of the first substrate of the solder ball portion is greater than a width of the connecting portion in a direction perpendicular to an extension direction of the connecting portion between adjacent solder ball portions.

2. The semiconductor package of claim 1, wherein a distance between adjacent solder ball portions is less than 0.05 times the maximum width of the solder ball portion in the first direction.

3. The semiconductor package of claim 1, further comprising:

an interposer placed on the shielding structure, wherein the interposer includes a second insulating layer and a second conductive pattern in the second insulating layer; and
a connection terminal disposed between the first substrate and the interposer, wherein the connection terminal electrically connects the first conductive pattern and the second conductive pattern,
wherein the maximum width of the solder ball portion in the first direction differs from a maximum width of the connection terminal.

4. The semiconductor package of claim 3, wherein the maximum width of the solder ball portion in the first direction is greater than the maximum width of the connection terminal.

5. The semiconductor package of claim 1, further comprising:
a first dam disposed on the upper surface of the first substrate, between the ball array structure and the first semiconductor chip along an inner perimeter of the ball array structure; and
a second dam disposed on the upper surface of the first substrate along an outer perimeter of the ball array structure.

6. The semiconductor package of claim 1, further comprising:
a first trench formed inside the upper surface of the first substrate wherein the first trench extends along a perimeter of the first semiconductor chip between the ball array structure and the side wall of the first semiconductor chip; and
a second trench formed inside the upper surface of the first substrate wherein the second trench extends along a perimeter of an outer wall of the ball array structure.

7. A semiconductor package, comprising:
a first substrate that includes a first insulating layer, and a ground pattern and a first conductive pattern inside the first insulating layer;
a first semiconductor chip placed on an upper surface of the first substrate;
a ball array structure that is placed on the upper surface of the first substrate, is electrically connected to the ground pattern, extends along a perimeter of the first semiconductor chip and is adjacent to the first semiconductor chip; and
a shielding structure that is placed on an upper surface of the first semiconductor chip and is in contact with at least a part of an upper surface of the ball array structure,
wherein the ball array structure has a closed loop shape and includes a material that differs from that of the shielding structure.

8. The semiconductor package of claim 7, wherein the upper surface of the ball array structure is substantially coplanar with the upper surface of the first semiconductor chip.

9. The semiconductor package of claim 7, wherein the ball array structure includes a solder ball portion spaced apart from the first semiconductor chip, and a connecting portion that connects adjacent solder ball portions.

10. The semiconductor package of claim 9, wherein a maximum width in a first direction parallel to the upper surface of the first substrate of the solder ball portion is greater than a width of the connecting portion in a direction perpendicular to an extension direction of the connecting portion between adjacent solder ball portions.

11. The semiconductor package of claim 9, further comprising:
a ground terminal placed on a lower surface of the first substrate wherein the ground terminal is electrically connected to the ground pattern and is placed on an outermost part of the first substrate.

12. The semiconductor package of claim 9, wherein the shielding structure completely covers the upper surface of the ball array structure, and has a length that is substantially equal to a length of the first substrate, and
the semiconductor package further includes a molding film that is disposed between the shielding structure and the first substrate and wraps side surfaces of the first semiconductor chip and the ball array structure.

13. The semiconductor package of claim 7, wherein the shielding structure includes either silver (Ag) or copper (Cu).

14. The semiconductor package of claim 7, wherein the shielding structure includes a shielding layer, and an adhesive layer placed between the shielding layer and the first semiconductor chip.

15. The semiconductor package of claim 14, wherein the adhesive layer includes a heat transfer material.

16. The semiconductor package of claim 7, further comprising
an interposer placed on the shielding structure, wherein the interposer includes a second insulating layer and a second conductive pattern in the second insulating layer; and
a connection terminal disposed between the first substrate and the interposer, wherein the connection terminal electrically connects the first conductive pattern and the second conductive pattern,
wherein a height of the ball array structure is less than a height of the connection terminal in a direction from the first substrate toward the interposer.

17. A semiconductor package, comprising:
a first substrate that includes a first insulating layer, a ground pattern in the first insulating layer, and a first conductive pattern;
a first semiconductor chip placed on an upper surface of the first substrate;
a ball array structure placed on the upper surface of the first substrate and adjacent to the first semiconductor chip, wherein the ball array structure is electrically connected to the ground pattern, extends along a perimeter of the first semiconductor chip, and has a closed loop shape;
a shielding structure disposed on an upper surface of the first semiconductor chip, wherein the shielding structure is in contact with at least a part of an upper surface of the ball array structure and the upper surface of the first semiconductor chip;
an interposer placed on the shielding structure wherein the interposer includes a second insulating layer and a second conductive pattern placed in the second insulating layer;
a connection terminal placed between the first substrate and the interposer wherein the connection terminal electrically connects the first conductive pattern and the second conductive pattern;
a second substrate placed on the interposer; and
a second semiconductor chip placed on the second substrate wherein the second semiconductor chip is electrically connected to the first substrate through the second substrate, the interposer, and the connection terminal, wherein the ball array structure includes a solder ball portion that is spaced apart from the first semiconductor chip, and a connecting portion that connects adjacent solder ball portions, a maximum width in a first direction parallel to the upper surface of the first substrate of the solder ball portion is greater than a maximum width of the connecting portion in a direction perpendicular to an extension direction of the connecting portion between adjacent solder ball portions, and is greater than a maximum width of the connection terminal, in the first direction, and the shielding structure includes a material that differs from that of the ball array structure.

18. The semiconductor package of claim 17, wherein the maximum width of the solder ball portion is less than 500 μm, and a distance between adjacent solder ball portions is less than 25 μm.

19. The semiconductor package of claim 1, wherein the maximum with of the solder ball portion in the first direction is less than 500 μm.

\* \* \* \* \*